ус011087795B2

(12) United States Patent
Yamamoto et al.

(10) Patent No.: US 11,087,795 B2
(45) Date of Patent: Aug. 10, 2021

(54) MAGNETIC DISK DEVICE

(71) Applicants: KABUSHIKI KAISHA TOSHIBA, Minato-ku (JP); TOSHIBA ELECTRONIC DEVICES & STORAGE CORPORATION, Minato-ku (JP)

(72) Inventors: Nobuhiro Yamamoto, Yokohama (JP); Yousuke Hisakuni, Sagamihara (JP)

(73) Assignees: KABUSHIKI KAISHA TOSHIBA, Minato-ku (JP); TOSHIBA ELECTRONIC DEVICES & STORAGE CORPORATION, Minato-ku (JP)

( * ) Notice: Subject to any disclaimer, the term of this patent is extended or adjusted under 35 U.S.C. 154(b) by 0 days.

(21) Appl. No.: 16/561,867

(22) Filed: Sep. 5, 2019

(65) Prior Publication Data

US 2020/0294546 A1    Sep. 17, 2020

(30) Foreign Application Priority Data

Mar. 15, 2019  (JP) .............................. JP2019-048722

(51) Int. Cl.
*G11B 20/10* (2006.01)
*H05K 1/11* (2006.01)
*H05K 1/02* (2006.01)

(52) U.S. Cl.
CPC .......... *G11B 20/10* (2013.01); *H05K 1/0277* (2013.01); *H05K 1/115* (2013.01); *H05K 2201/10159* (2013.01)

(58) Field of Classification Search
CPC ...... H01R 12/62; H01R 12/79; H01R 43/205; H01R 12/91; H01R 13/74; H01R 12/778;
(Continued)

(56) References Cited

U.S. PATENT DOCUMENTS 5,357,386 A * 10/1994 Haidari ............... G11B 5/4846
360/99.18
6,970,322 B2 * 11/2005 Bernett ............... G11B 25/043
360/245.9
(Continued)

FOREIGN PATENT DOCUMENTS

CN    108962300 A    12/2018
CN    109427357 A    3/2019
(Continued)

*Primary Examiner* — Brian E Miller
(74) *Attorney, Agent, or Firm* — Oblon, McClelland, Maier & Neustadt, L.L.P.

(57) ABSTRACT

According to one embodiment, a magnetic disk device includes a housing having a box-shaped base with a bottom wall, a first connection portion provided inside the bottom wall, a second connection portion provided outside the bottom wall and electrically connected to the first connection portion, a control circuit board provided outside the housing, a third connection portion fixed to an inner surface of the control circuit board facing the bottom wall, and abutting on and electrically connecting to the second connection portion, and a reinforcement member positioned between the control circuit board and the bottom wall and provided around the third connection portion.

7 Claims, 19 Drawing Sheets

(58) Field of Classification Search
CPC .................. H01R 31/06; H01R 12/78; H05K 2201/10189; H05K 2201/09445; H05K 2201/10507; H05K 2201/056; H05K 1/118; H05K 1/028; H05K 1/181; G11B 5/4826; G11B 5/4846; G11B 33/122; G11B 33/14; G11B 33/148; G11B 25/043; G11B 33/1466; G11B 33/027
See application file for complete search history.

(56) References Cited

U.S. PATENT DOCUMENTS

| | | | |
|---|---|---|---|
| 8,059,364 B1 * | 11/2011 | Andrikowich | G11B 25/043 360/99.22 |
| 8,098,454 B2 * | 1/2012 | Kouno | G11B 33/1466 360/99.21 |
| 9,230,598 B1 * | 1/2016 | Bernett | G11B 25/043 |
| 9,431,759 B2 * | 8/2016 | Hirano | G11B 25/043 |
| 9,458,936 B2 * | 10/2016 | Bernett | G11B 25/043 |
| 9,672,870 B1 * | 6/2017 | Mizumoto | G11B 33/022 |
| 9,721,619 B2 * | 8/2017 | Sudo | G11B 25/043 |
| 9,886,984 B2 * | 2/2018 | Akagi | G11B 33/122 |
| 9,886,985 B1 * | 2/2018 | Okamoto | G11B 33/027 |
| 9,899,048 B1 * | 2/2018 | Vijay | H05K 1/0278 |
| 10,162,393 B2 * | 12/2018 | Fruge | G06F 1/187 |
| 10,424,345 B1 * | 9/2019 | Namihisa | G11B 33/1466 |
| 10,594,100 B1 * | 3/2020 | Namihisa | H01R 12/78 |
| 10,602,633 B2 * | 3/2020 | Hisakuni | H05K 5/03 |
| 10,741,223 B2 * | 8/2020 | Kaneko | H05K 5/0247 |
| 2004/0257698 A1 * | 12/2004 | Bernett | G11B 33/122 360/99.18 |
| 2006/0050429 A1 * | 3/2006 | Gunderson | G11B 25/043 360/99.21 |
| 2008/0316641 A1 | 12/2008 | Gunderson et al. | |
| 2009/0097163 A1 | 4/2009 | Suzuki et al. | |
| 2017/0221527 A1 * | 8/2017 | Choe | B29C 65/48 |
| 2017/0294737 A1 * | 10/2017 | Horchler | H01R 13/5205 |
| 2018/0337477 A1 | 11/2018 | Yamamoto et al. | |
| 2019/0074615 A1 * | 3/2019 | Okamoto | G11B 5/012 |

FOREIGN PATENT DOCUMENTS

| | | |
|---|---|---|
| JP | 6-46069 Y2 | 11/1994 |
| JP | 8-1583 Y2 | 1/1996 |
| JP | 2009-4064 A | 1/2009 |
| JP | 2009-97026 A | 5/2009 |
| JP | 2018-5960 A | 1/2018 |

* cited by examiner

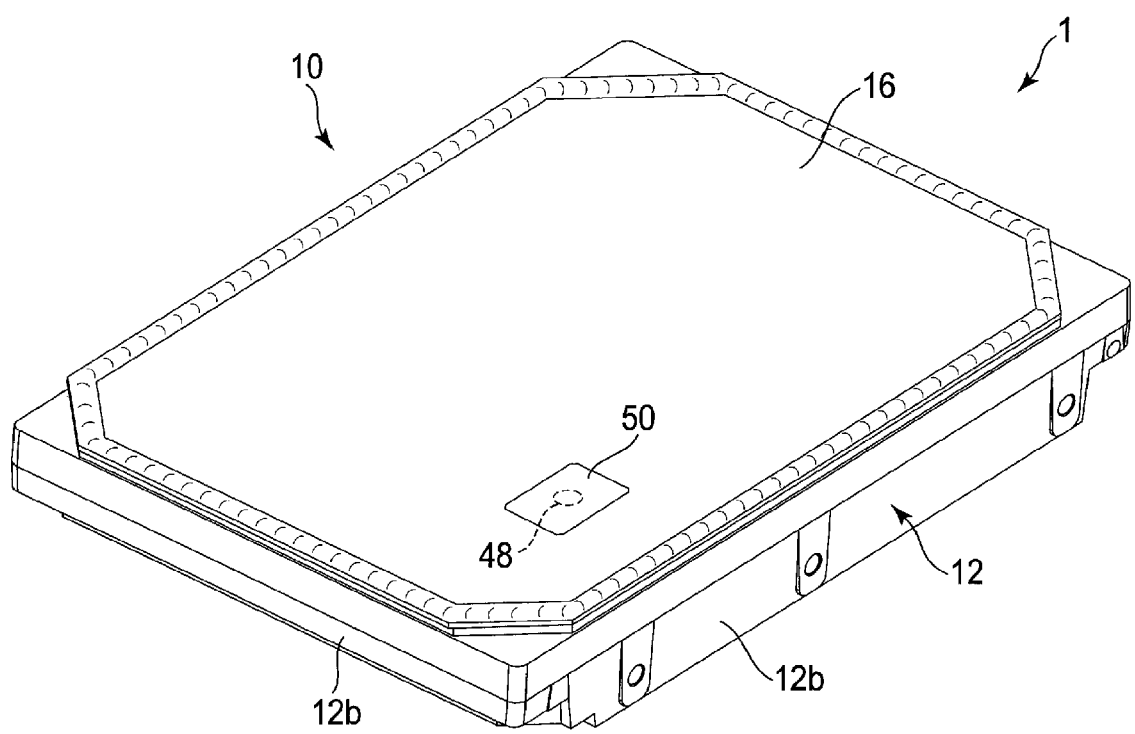
F I G. 1

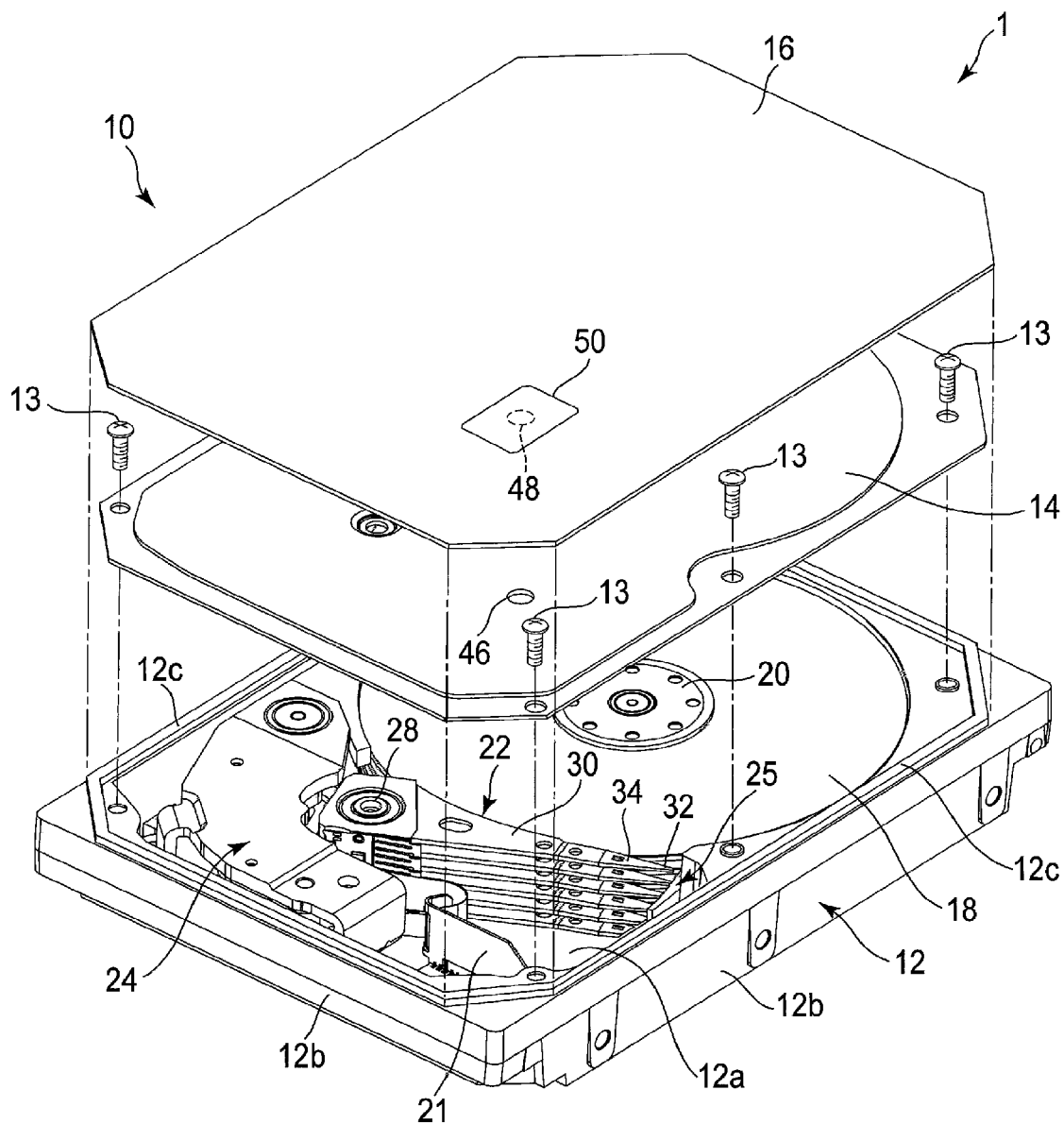
F I G. 2

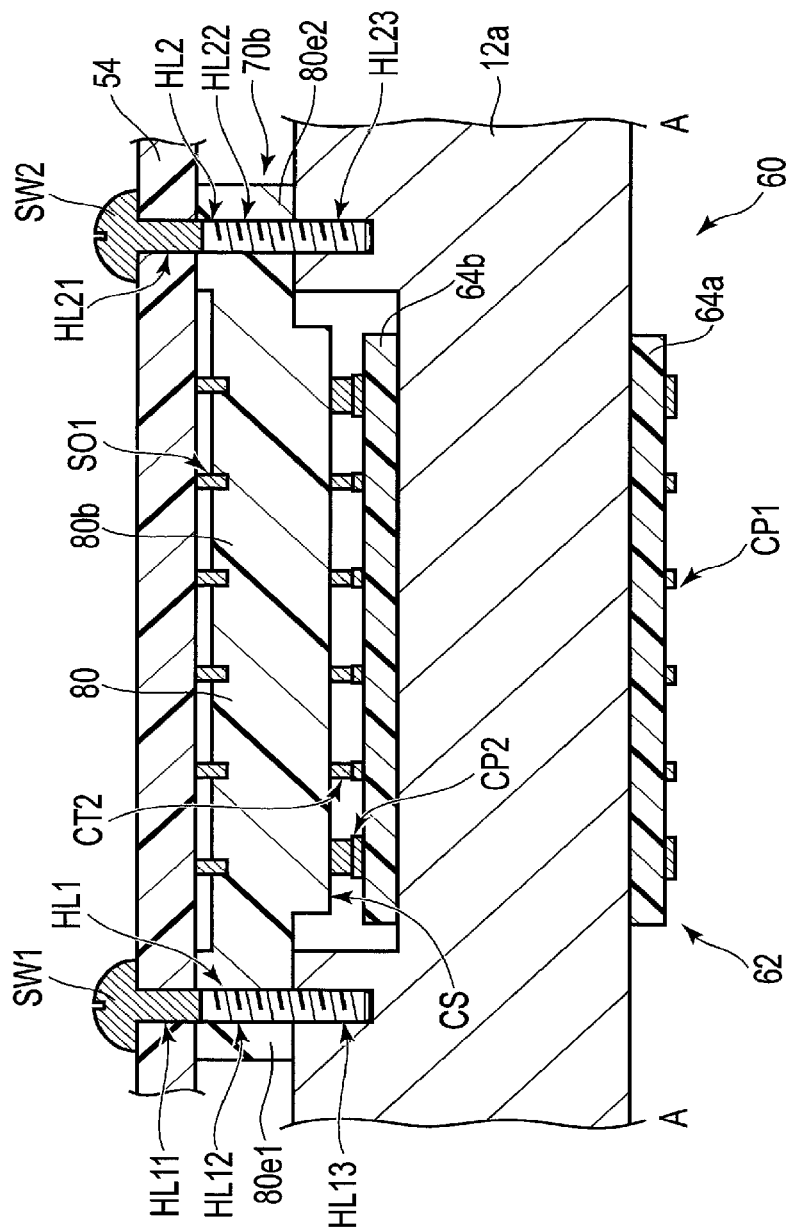
F I G. 7

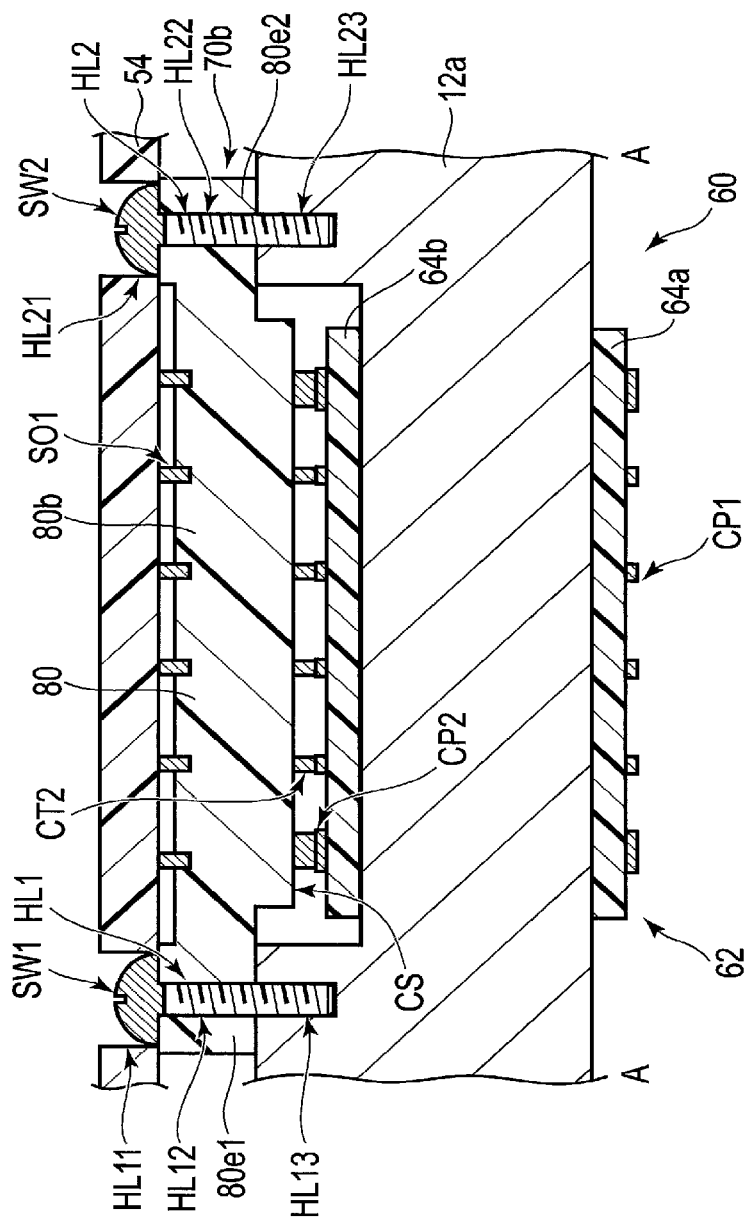
F I G. 9

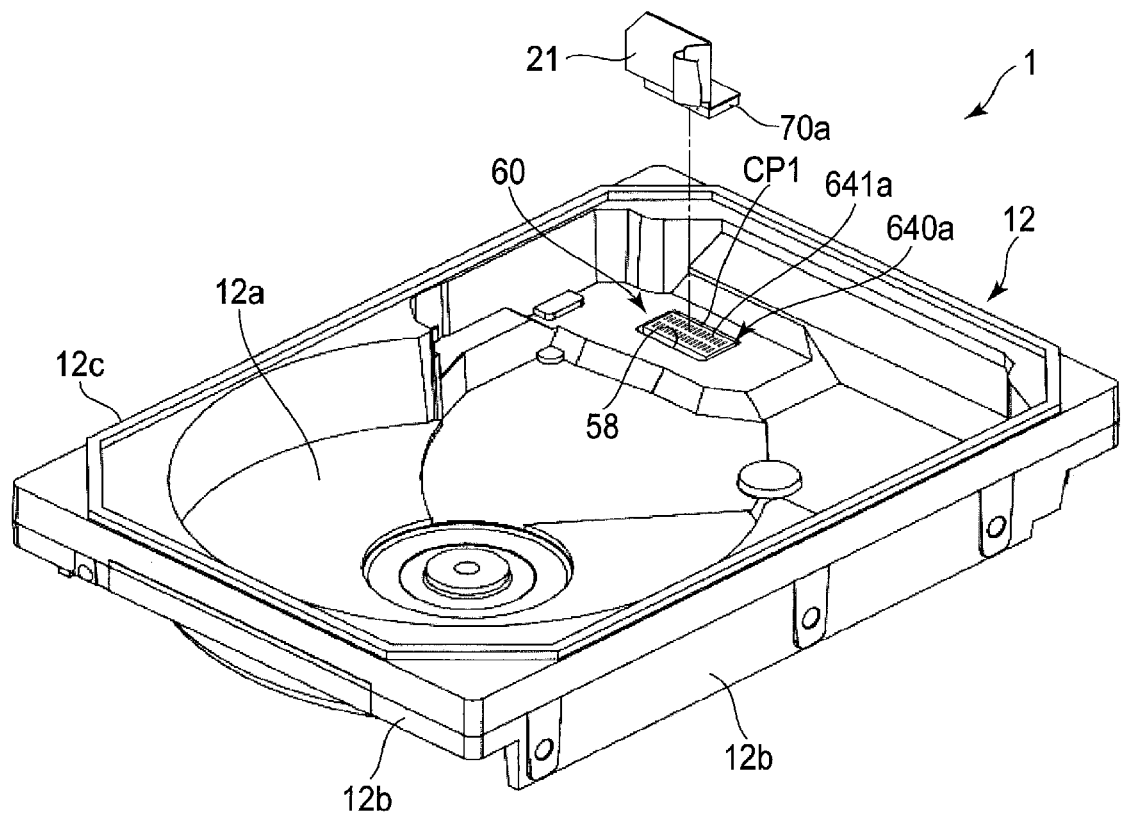
F I G. 10

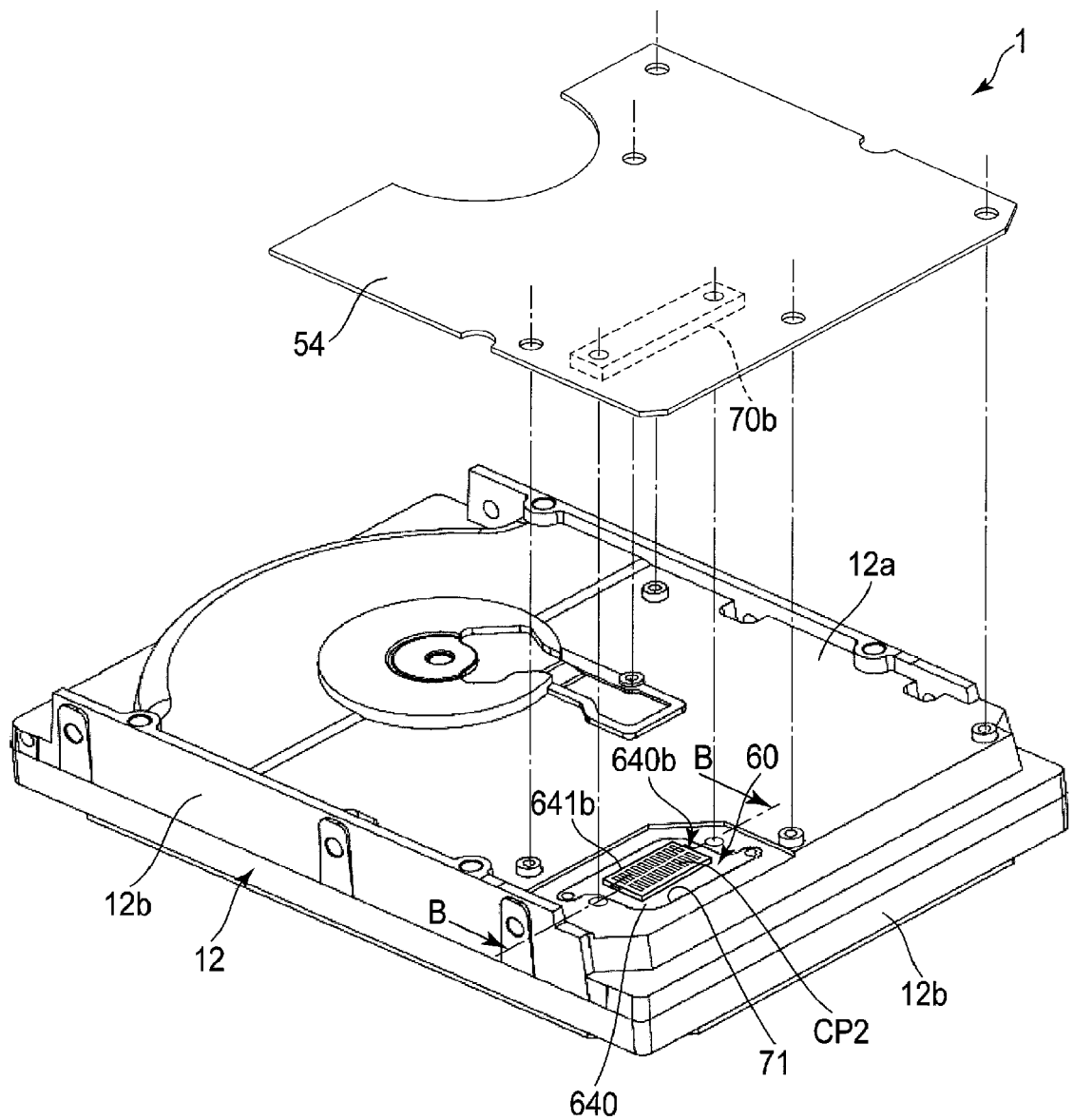
F I G. 11

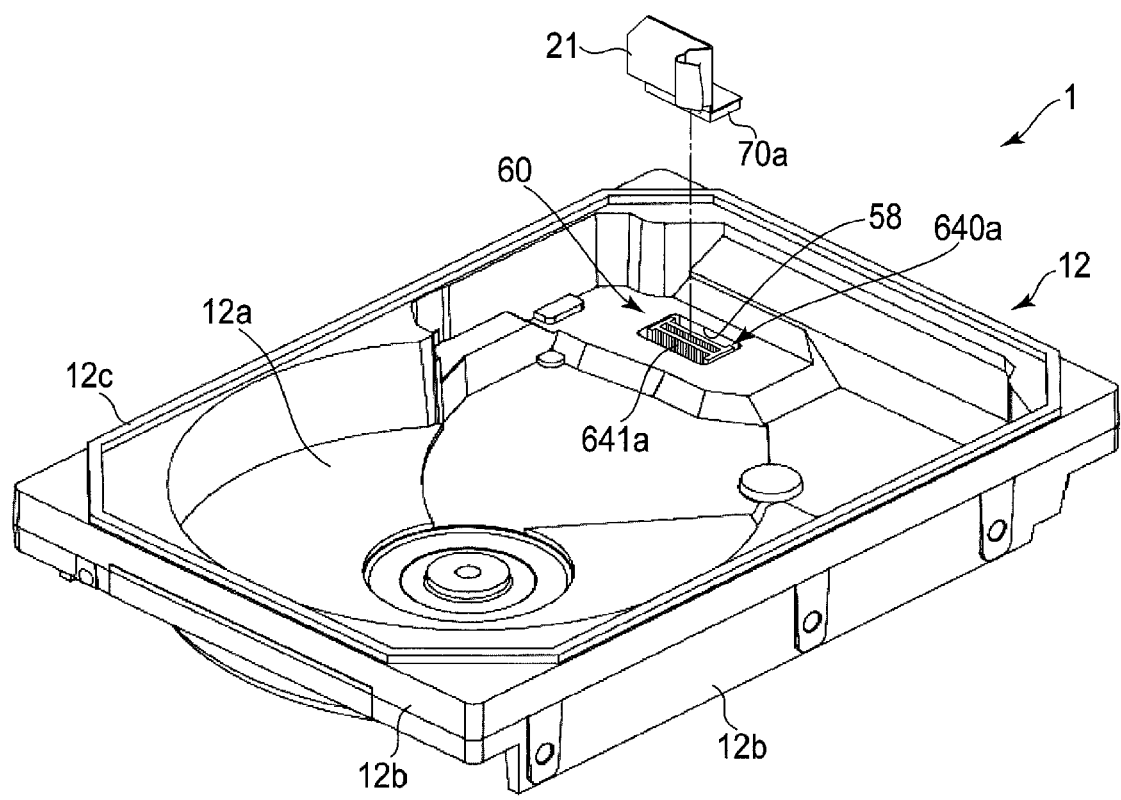
F I G. 18

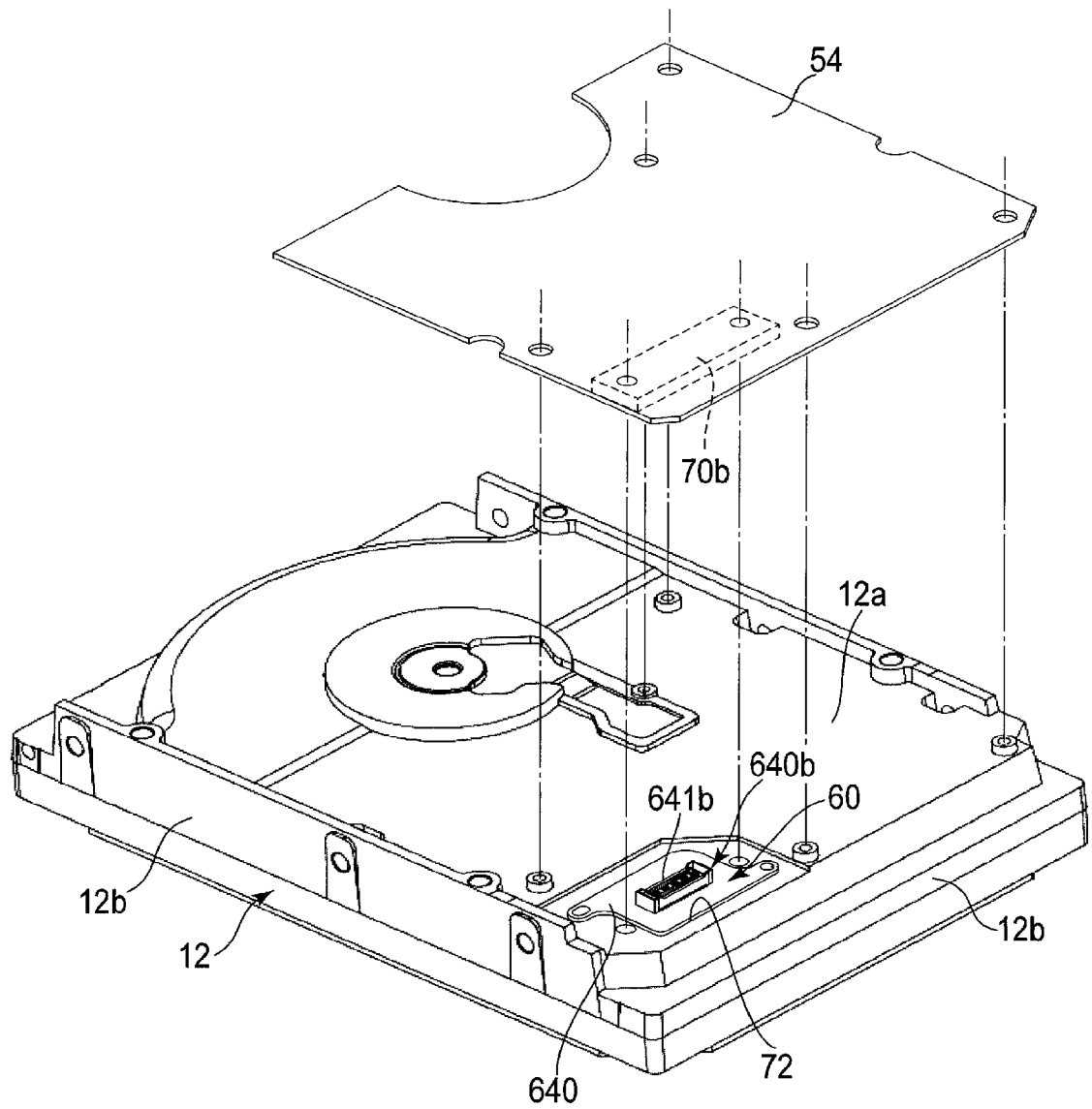
F I G. 19

MAGNETIC DISK DEVICE

CROSS-REFERENCE TO RELATED APPLICATIONS

This application is based upon and claims the benefit of priority from Japanese Patent Application No. 2019-048722, filed Mar. 15, 2019, the entire contents of which are incorporated herein by reference.

FIELD

Embodiments described herein relate generally to a magnetic disk device.

BACKGROUND

Generally, a magnetic disk device includes a housing and a plurality of electronic components disposed in the housing. The electronic components are electrically connected to other electronic components provided outside the housing through a connection mechanism such as a connector or a wiring board.

BRIEF DESCRIPTION OF THE DRAWINGS

FIG. 1 is a perspective view illustrating an appearance of a magnetic disk device according to a first embodiment.

FIG. 2 is an exploded perspective view illustrating the internal structure of the magnetic disk device.

FIG. 7 is a cross-sectional view of a part of the bottom wall of the magnetic disk device, taken along line A-A illustrated in FIG. 4.

FIG. 9 is a cross-sectional view of a part of a bottom wall of a magnetic disk device according to modification 1.

FIG. 10 is a perspective view illustrating a base of the housing, from which most of components are removed.

FIG. 11 is a perspective view illustrating the rear side of the housing and a control circuit board.

FIG. 18 is a perspective view illustrating a base of the housing, from which most of components are removed.

FIG. 19 is a perspective view illustrating the rear side of the housing and the control circuit board.

DETAILED DESCRIPTION

Figure 3:
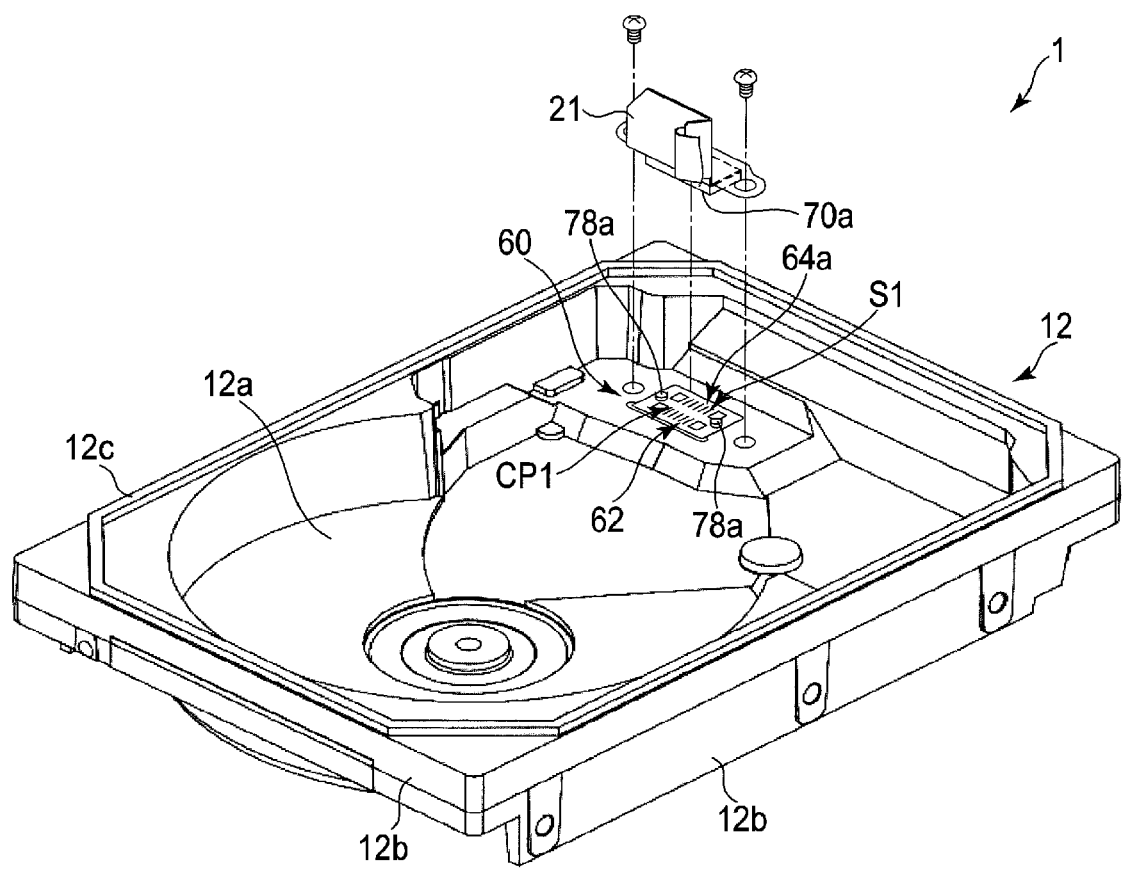
FIG. 3 is a perspective view illustrating a base of the housing, from which most of components are removed.

In general, according to one embodiment, a magnetic disk device comprises: a housing having a box-shaped base with a bottom wall; a first connection portion provided inside the bottom wall; a second connection portion provided outside the bottom wall and electrically connected to the first connection portion; a control circuit board provided outside the housing; a third connection portion fixed to an inner surface of the control circuit board facing the bottom wall, and abutting on and electrically connecting to the second connection portion; and a reinforcement member positioned between the control circuit board and the bottom wall and provided around the third connection portion.

Hereinafter, embodiments will be described with reference to the drawings. Note that the drawings are merely examples and do not limit the scope of the invention.

First Embodiment

As an example of an electronic device, a magnetic disk device according to an embodiment, for example, a hard disk drive (HDD), will be described in detail.

FIG. 1 is a perspective view illustrating an appearance of a magnetic disk device 1 according to a first embodiment, and FIG. 2 is an exploded perspective view illustrating the internal structure of the magnetic disk device 1.

As illustrated in FIGS. 1 and 2, the magnetic disk device 1 includes a housing 10 having a flat and substantially rectangular parallelepiped shape. The housing 10 includes a base 12 having a rectangular box shape with an opened upper surface, an inner cover 14 screwed to the base 12 by a plurality of screws 13 to close an upper end opening of the base 12, and an outer cover (top cover) 16 disposed to overlap the inner cover 14 and having a circumferential edge portion welded to the base 12. The base 12 includes a rectangular bottom wall 12a facing the inner cover 14 with a gap therebetween, and a side wall 12b provided upright along the periphery of the bottom wall 12a. The base 12 is integrally formed of, for example, an aluminum alloy. The side wall 12b includes a pair of long side walls facing each other and a pair of short side walls facing each other. A fixing rib 12c having a substantially rectangular frame shape is provided on the upper end surface of the side wall 12b.

The inner cover 14 is formed of, for example, stainless steel in a rectangular plate shape. The inner cover 14 has a peripheral edge portion screwed to the upper surface of the side wall 12b of the base 12 by the screw 13 and is fixed to the inside of the fixing rib 12c. The outer cover 16 is formed of, for example, aluminum in a rectangular plate shape. The outer cover 16 is formed to have a slightly larger planar dimension than that of the inner cover 14. The outer cover 16 is welded and fixed airtightly to the fixing rib 12c of the base 12 along the entire peripheral edge portion thereof.

Vent holes 46 and 48 are respectively formed in the inner cover 14 and the outer cover 16 to communicate the inside of the housing 10 with the outside of the housing 10. Air in the housing 10 is exhausted through the vent holes 46 and 48, and furthermore, low density gas (inert gas) having a density lower than that of air, such as helium, is enclosed in the housing 10 through the vent holes 46 and 48. For example, a seal (sealing body) 50 is attached to the outer surface of the outer cover 16 so as to close the vent hole 48.

As illustrated in FIG. 2, a plurality of magnetic disks 18, for example, five to nine magnetic disks 18, as a recording medium and a spindle motor 20 as a driving unit which supports and rotates the magnetic disks 18 are provided in the housing 10. The spindle motor 20 is disposed on the bottom wall 12a. The respective magnetic disks 18 are formed to have a diameter of, for example, 95 mm (3.5 inches), and include magnetic recording layers on the upper surface and/or the lower surface thereof. The respective magnetic disks 18 are coaxially fitted to a hub (not illustrated) of the spindle motor 20 and are clamped by a clamp spring and fixed to the hub. Therefore, the respective magnetic disks 18 are supported in parallel with the bottom wall 12a of the base 12. The magnetic disks 18 are rotated by the spindle motor 20 at a predetermined rotational speed.

In the present embodiment, for example, five to nine magnetic disks 18 are accommodated in the housing 10, but the number of magnetic disks 18 is not limited thereto. A single magnetic disk 18 may be accommodated in the housing 10.

A plurality of magnetic heads 32 which record and read information on and from the magnetic disks 18, and a head stack assembly (actuator) 22 which movably supports the magnetic heads 32 with respect to the magnetic disks 18 are provided in the housing 10. The actuator 22 includes a rotatable bearing unit 28, a plurality of arms 30 extending from the bearing unit 28, and suspensions 34 extending from the respective arms 30. A magnetic head 32 is supported at the tip of each suspension 34.

In addition, a voice coil motor (hereinafter referred to as a VCM) 24 which rotates and positions the actuator 22, a ramp loading mechanism 25 which holds the magnetic head 32 at an unloading position separated from the magnetic disk 18 when the magnetic head 32 moves to the outermost periphery of the magnetic disk 18, and a substrate unit (first electric component) 21 on which electronic components including a conversion connector (first connector) 70a and like are mounted are provided in the housing 10. The substrate unit 21 is configured by a flexible printed wiring board (FPC). The FPC is electrically connected to the magnetic head 32 and a voice coil of the VCM 24 via a relay FPC on the actuator 22.

Figure 4:
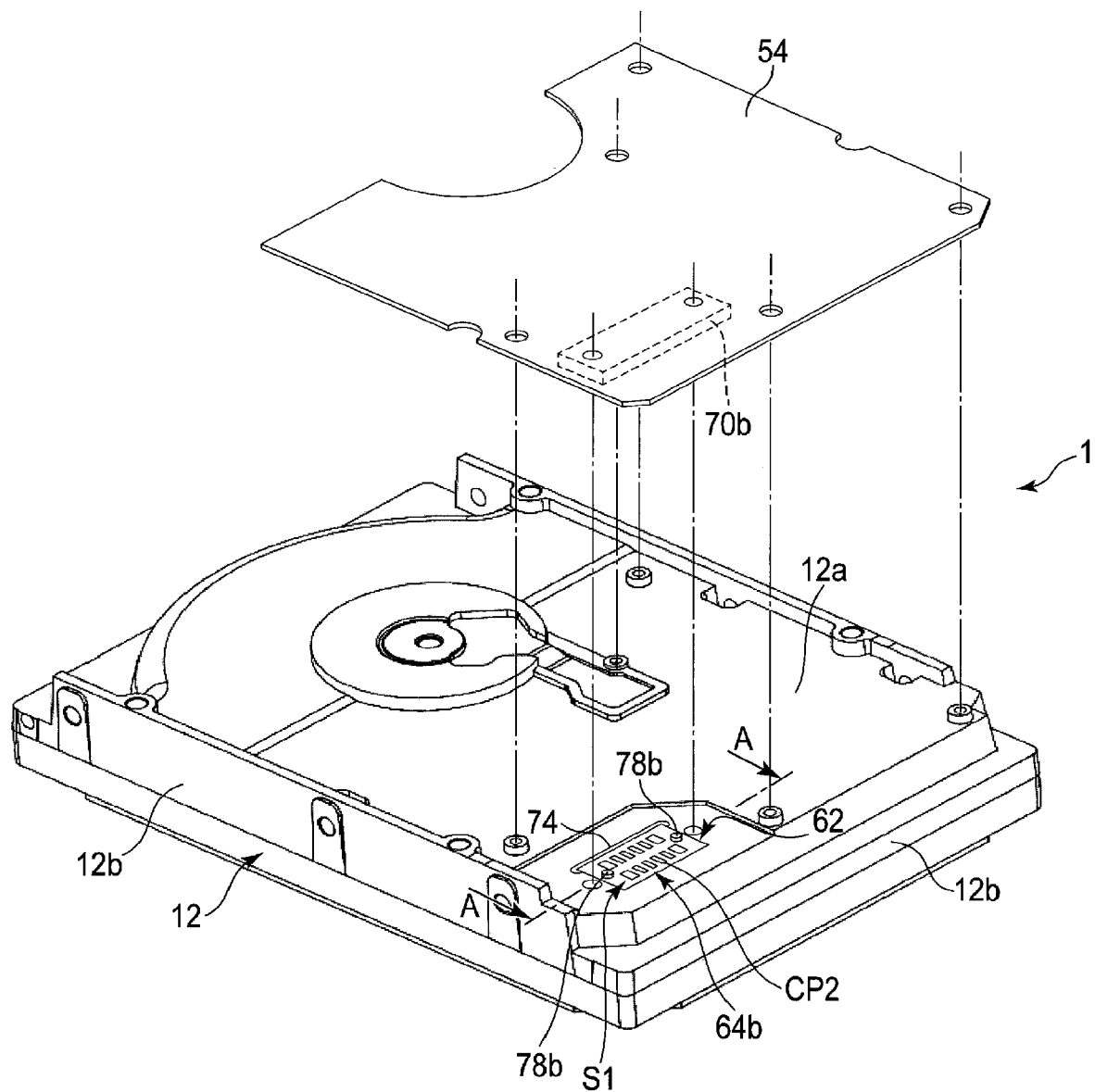
FIG. 4 is a perspective view illustrating a rear side of the housing and a control circuit board.

FIG. 3 is a perspective view illustrating the base of the housing, from which most of components are removed, and FIG. 4 is a perspective view illustrating the rear side of the housing and a control circuit board.

As illustrated in FIG. 4, as a second electric component, for example, a control circuit board 54 is disposed to face the outer surface of the bottom wall 12a of the base 12. The control circuit board 54 is screwed to the bottom wall 12a. Electronic components such as an IC (not illustrated), a coil, a capacitor, and a resistor are mounted on the control circuit board 54, and a control unit which controls the operation or arithmetic processing of the magnetic disk device 1 is configured by the electronic components and wirings provided on the control circuit board 54. The control unit controls the operation of the spindle motor 20 and controls the operations of the VCM 24 and the magnetic head 32 via the substrate unit 21. A second connector 70b is mounted on the inner surface of the control circuit board 54, that is, the surface facing the bottom wall 12a, and is electrically connected to the control circuit board 54.

As illustrated in FIGS. 3 and 4, the magnetic disk device 1 includes a connection mechanism 60 which electrically connects the first electric component (substrate unit 21) disposed in the housing 10 and the second electric component (control circuit board 54) disposed outside the housing 10. The connection mechanism 60 includes a flexible printed wiring board (FPC) 62 provided on the bottom wall 12a, the first connector 70a electrically connected to the substrate unit 21, and the second connector 70b connected to the control circuit board 54. Hereinafter, the FPC 62 may be referred to as a relay member 62. The substrate unit 21 is electrically connected to the control circuit board 54 via the first connector 70a, the FPC 62, and the second connector 70b.

The FPC 62 is formed in a film shape having a thin and flat band shape. The FPC 62 includes, for example, a base insulating layer formed of an insulating synthetic resin such as polyimide, a conductive layer stacked on the base insulating layer, and a cover insulating layer overlapped and stacked on the base insulating layer and the conductive layer. The conductive layer is formed of, for example, a conductive metal material such as a copper-based material, and is patterned to form a plurality of wirings and a plurality of connection pads. The cover insulating layer is formed of, for example, an insulating synthetic resin such as polyimide, and covers the conductive layer and the base insulating layer, except for the connection pads. The connection pads are exposed to a first surface S1 of the FPC 62. In the present embodiment, the first surface S1 of the FPC 62 is a surface formed by the cover insulating layer, and the surface (not illustrated) opposite to the first surface S1 is a surface formed by the base insulating layer.

The FPC 62 includes a first connection portion 64a, a second connection portion 64b, and a relay portion 64c described later. The relay portion 64c connects the first connection portion 64a and the second connection portion 64b.

The first connection portion 64a is formed in a rectangular shape. A plurality of first connection pads CP1 are provided in the first connection portion 64a. The first connection pads CP1 are arranged in, for example, two columns. Each of the first connection pads CP1 is formed in, for example, a rectangular shape. Each of the columns extends in a direction orthogonal to a longitudinal direction of the FPC 62, for example, in a width direction. In each of the columns, the plurality of first connection pads, for example, six first connection pads are spaced apart from each other. In addition, the two columns are spaced apart from each other and extend parallel to each other.

The second connection portion 64b is formed in a rectangular shape. A plurality of second connection pads CP2 are provided in the second connection portion 64b. Each of the second connection pads CP2 is formed in, for example, a rectangular shape. The second connection pads CP2 are arranged in, for example, two columns. Each of the columns extends in the width direction of the FPC 62. In each of the columns, the plurality of second connection pads, for example, six second connection pads are spaced apart from each other. In addition, the two columns are spaced apart from each other and extend parallel to each other.

Figure 5:
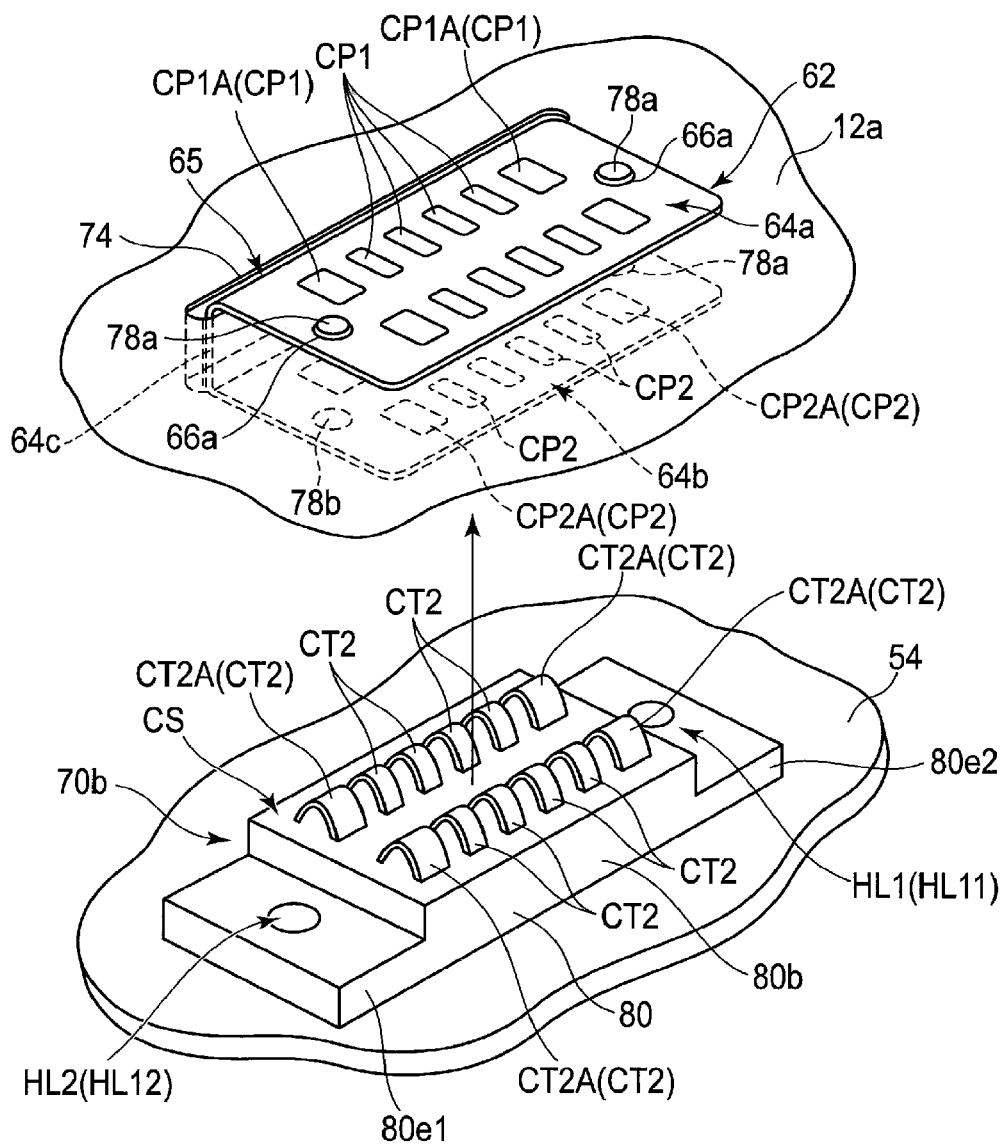
FIG. 5 is a perspective view illustrating a flexible printed circuit board and a second connector disposed in the housing.

FIG. 5 is a perspective view illustrating the flexible printed wiring board 62 and the second connector 70b disposed in the housing 10.

As illustrated in FIG. 5, a slit-shaped through hole 74 is provided at a predetermined position of the bottom wall 12a.

The through hole 74 has, for example, an elongated rectangular cross-sectional shape, and has a length slightly larger than a width of the FPC 62 and a width slightly larger than a thickness of the FPC 62. The through hole 74 is formed to pass through the bottom wall 12a and is opened in the inner and outer surfaces of the bottom wall 12a.

The bottom wall 12a has a pair of bosses (positioning pins) 78a provided on the inner surface of the bottom wall in the vicinity of the through hole 74. In addition, the bottom wall 12a has a pair of bosses (positioning pins) 78b provided on the outer surface of the bottom wall in the vicinity of the through hole 74. The bosses 78a and 78b are formed in, for example, a cylindrical shape. The bosses 78a and 78b may be integrally formed with the bottom wall 12a, or may be constituted by separate pins fixed to the bottom wall 12a.

The FPC 62 is inserted into the through hole 74, and the relay portion 64c of the FPC 62 is positioned in the through hole 74. The first connection portion 64a is bent to the inner surface side of the bottom wall 12a with respect to the relay portion 64c, and is positioned to face the inner surface of the bottom wall 12a. In addition, the bosses 78a are respectively fitted to a pair of positioning holes 66a of the first connection portion 64a. Therefore, the first connection portion 64a is positioned and held on the inner surface of the bottom wall 12a in a state in which the first connection pads CP1 face the inside of the housing 10.

At least one first connection pad among the first connection pads CP1 has a larger dimension and a larger contact area than those of the other first connection pads. For example, at least one first connection pad is formed to have a width larger than the widths of the other first connection pads. Two first connection pads CP1A positioned at one end and the other end of each column are formed to have a larger width (for example, 1.2 to 2 times the width) than those of the other first connection pads CP1 in the same column. The other first connection pads CP1 are formed to have the same dimension. The first connection pad CP1A may have the same width as those of the other first connection pads CP1.

The second connection portion 64b is bent to the outer surface side of the bottom wall 12a with respect to the relay portion 64c, and is positioned to face the outer surface of the bottom wall 12a. In addition, the bosses 78b are respectively fitted to a pair of positioning holes 66b of the second connection portion 64b. Therefore, the second connection portion 64b is positioned and held on the outer surface of the bottom wall 12a in a state in which the second connection pad CP2 faces the inside of the housing 10.

At least one second connection pad among the second connection pads CP2 is formed to have a larger dimension, for example, a larger width than those of the other second connection pads. Two second connection pads CP2A positioned at one end and the other end of each column are formed to have a larger width (for example, 1.2 to 2 times the width) than those of the other second connection pads CP2 in the same column. The other second connection pads CP2 are formed to have the same dimension. The second connection pad CP2A may have the same width as those of the other second connection pads CP2. The second connection pads CP2 are electrically connected to the corresponding first connection pads CP1 via the wirings of the FPC 62, respectively.

In the present embodiment, the second connection portion 64b is bent in the same direction as that of the first connection portion 64a. Therefore, the second connection portion 64b faces the first connection portion 64a with the bottom wall 12a interposed therebetween.

A sealant 65 is filled between the through hole 74 of the bottom wall 12a and the relay portion 64c of the FPC 62. The sealant 65 fills a gap between the through hole 74 and the relay portion 64c, prevents gas from leaking from the through hole 74, and fixes the relay portion 64c to the bottom wall 12a.

As illustrated in FIG. 5, the second connector 70b is configured as, for example, a compression connector. The second connector 70b includes a substantially rectangular base 80 formed of an insulating material, and a plurality of conductive connection terminals CT2. The connection terminal CT2 is formed by bending an elastic metal plate into a predetermined shape. The base 80 has a counter surface (inner surface) CS facing the second connection portion 64b. The base 80 is fixed to the control circuit board 54 on the surface opposite to the counter surface CS. The base 80 includes a main body portion 80b, an extension portion 80e1 extending in the longitudinal direction from the main body portion 80b, and an extension portion 80e2 extending in the longitudinal direction from the main body portion 80b on the side opposite to the extension portion 80e1. In other words, the extension portions 80e1 and 80e2 are disposed around the main body portion 80b. The extension portions 80e1 and 80e2 may also be referred to as reinforcement members 80e1 and 80e2. The extension portions 80e1 and 80e2 may be formed separately from the main body portion 80b. When the extension portions 80e1 and 80e2 and the main body portion 80b are separately formed, the main body portion 80b and the connection terminals CT2 fixed to the main body portion 80b may also be referred to as the second connector 70b or the connection portion 70b. In the extension portion 80e1, a through hole HL12 is formed. In the extension portion 80e2, a through hole HL22 is formed. In the example illustrated in FIG. 5, although the thicknesses of the extension portions 80e1 and 80e2 are smaller than the thickness of the main body portion 80b, the thicknesses of the extension portions 80e1 and 80e2 may be equal to the thickness of the main body portion 80b, or may be larger than the thickness of the main body portion 80b. In addition, the thicknesses of the extension portions 80e1 and 80e2 are equal to each other, but may be different from each other.

The connection terminals CT2 are fixed to the base 80, for example, the counter surface CS of the main body portion 80b. The connection terminals CT2 are arranged in, for example, two columns along the longitudinal direction of the base 80. In each of the columns, a plurality of connection terminals CT2, for example, six connection terminals CT2 are spaced apart from each other. In addition, the two columns are spaced apart from each other and extend parallel to each other. The number, the arrangement pitch, and the arrangement position of connection terminals CT2 are set according to the second connection pads CP2 of the FPC 62 described above.

One end portion of the connection terminal CT2 protrudes from the base 80, is soldered to a predetermined position of the control circuit board 54, and is mechanically and electrically connected to the control circuit board 54. The other end portion of the connection terminal CT2 protrudes from the base 80 in a direction opposite to the control circuit board 54, that is, toward the housing 10 side. The other end portion is folded back toward the base 80 side at an intermediate portion, and constitutes a contact that can elastically abut on the connection pad of the FPC 62.

At least one connection terminal among the connection terminals CT2 is formed to have a larger width or a larger diameter than those of the other connection terminals CT2. Two connection terminals CT2A positioned at one end and the other end of each column are formed to have a larger width (for example, 1.2 to 2 times the width) than those of the other connection terminals CT2 in the same column. The other connection terminals CT2 are formed to have the same dimension. The wide connection terminals CT2A are provided corresponding to the wide second connection pads CP2A, respectively. The connection terminal CT2A may be common in width to the other connection terminals CT2.

Figure 6:
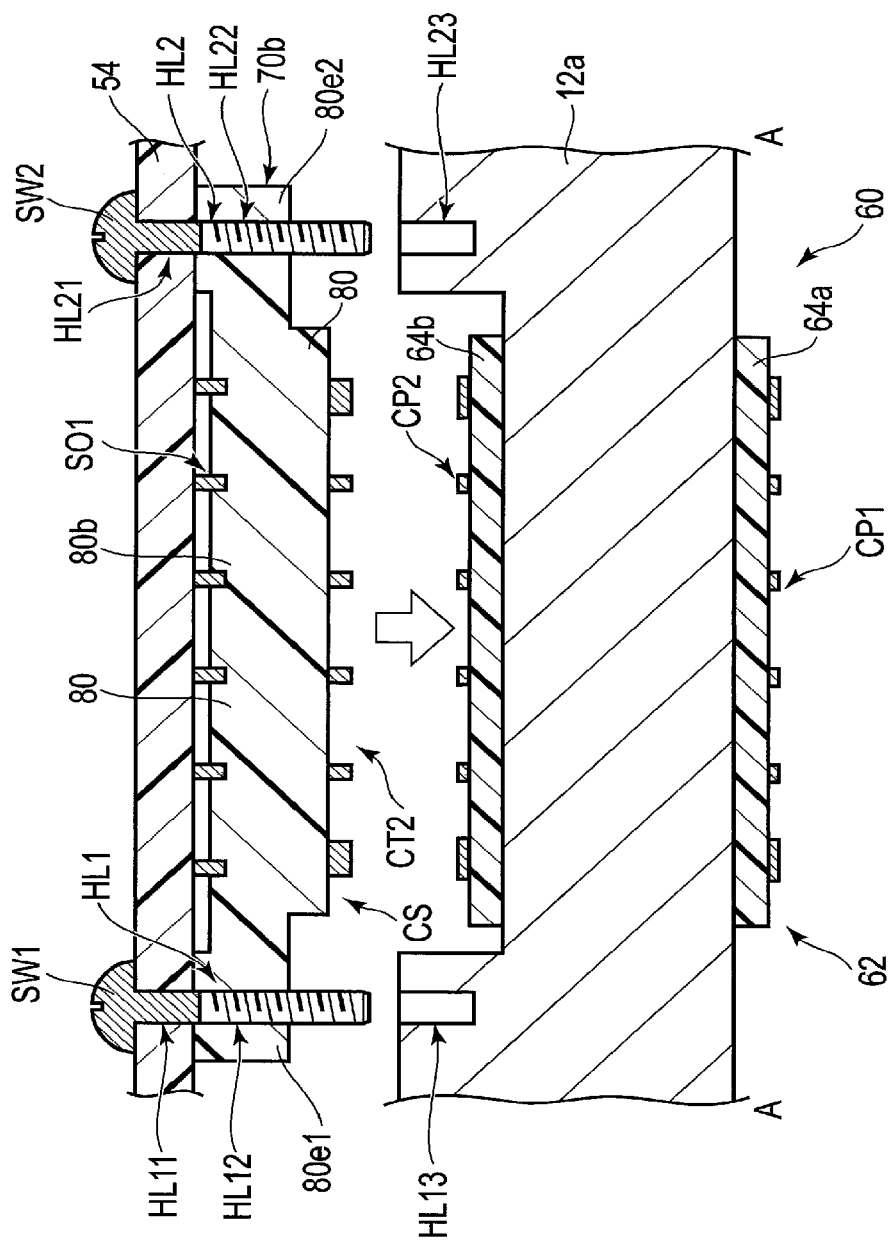
FIG. 6 is an exploded cross-sectional view of a part of a bottom wall of the magnetic disk device, taken along line A-A illustrated in FIG. 4.

FIG. 6 is an exploded cross-sectional view of a part of the bottom wall 12a of the magnetic disk device 1, taken along line A-A illustrated in FIG. 4, and FIG. 7 is a cross-sectional view of a part of the bottom wall 12a of the magnetic disk device 1, taken along line A-A illustrated in FIG. 4.

In the example illustrated in FIG. 6, the control circuit board 54 includes a through hole HL11 facing the through hole HL12 of the extension portion 80e1 of the base 80, and a through hole HL21 opposed to the through hole HL22 of the extension portion 80e2 of the base 80. The thickness of the control circuit board 54 is, for example, 0.1 to 0.9 millimeters. The thickness of the base 80 of the second connector 70b is, for example, several millimeters. The through hole HL12 of the extension portion 80e1 is, for example, a screw hole in which a screw groove is formed on the inner surface. In addition, the through hole HL22 of the extension portion 80e2 is, for example, a screw hole in which a screw groove is formed on the inner surface. The through holes HL12 and HL22 may not be screw holes. The main body portion 80b of the base 80 is fixed to and electrically connected to the control circuit board 54 in such a manner that one end portion of each of the connection terminals CT2 is soldered at a soldering portion SO1 on the inner surface of the control circuit board 54 facing the second connection portion 64b. In the bottom wall 12a, a hole portion HL13 facing the through holes HL11 and HL12 and having a bottom and a hole portion HL23 facing the through holes HL21 and HL22 and having a bottom portion are formed. The hole portions HL13 and HL23 are, for example, screw holes in which a screw groove is formed on the inner surface. The hole portions HL13 and HL23 may not be screw holes. In the bottom wall 12a, the hole portions HL13 and HL23 are formed around the connection mechanism 60, for example, the second connection portion 64b. The hole portion HL1 includes the through holes HL11 and HL12 and the hole portion HL13. In other words, the hole portion HL1 is formed by the through holes HL11 and HL12 and the hole portion HL13. The hole portion HL2 includes the through holes HL21 and HL22 and the hole portion HL23. In other words, the hole portion HL2 is formed by the through holes HL21 and HL22 and the hole portion HL23.

The control circuit board 54 and the second connector 70b are fixed to the surface (hereinafter also referred to as the rear surface or the outer surface) of the outer side of the bottom wall 12a. In the example illustrated in FIG. 7, the control circuit board 54 and the second connector 70b are fixed to the outer surface of the bottom wall 12a by screw portions SW1 and SW2. The second connector 70b may be bonded to the outer surface of the bottom wall 12a by an adhesive. The second connector 70b may be fixed to the outer surface of the bottom wall 12a by a connector. In addition, the control circuit board 54 may be bonded to the outer surface of the second connector 70b by a soldering and an adhesive at the soldering portion SO1 on the outer surface of the second connector 70b. The screw portion SW1 is screwed into the hole portion HL1. The screw portion SW2 is screwed into the hole portion HL2. The control circuit board 54 and the second connector 70b are fixed to the outer surface of the bottom wall 12a in such a manner that the screw portions SW1 and SW2 are screwed to the hole portions HL1 and HL2, respectively. When the control circuit board 54 and the second connector 70b are fixed to the outer surface of the bottom wall 12a by the screw portions SW1 and SW2, the extension portions 80e1 and 80e2 contact, for example, the outer surface of the bottom wall 12a around the second connection portion 64b. When the control circuit board 54 and the second connector 70b are fixed to the outer surface of the bottom wall 12a by the screw portions SW1 and SW2, the connection terminals CT2 fixed to the counter surface CS of the main body portion 80b elastically abut on and electrically connect to the second connection pads CP2 provided on the second connection portion 64b, respectively.

FIGS. 8A, 8B, 8C, and 8D are plan views illustrating examples of the shape of the second connector 70b. FIGS. 8A to 8D illustrate plan views when the second connector 70b is observed from the counter surface CS side.

Figure 8B:
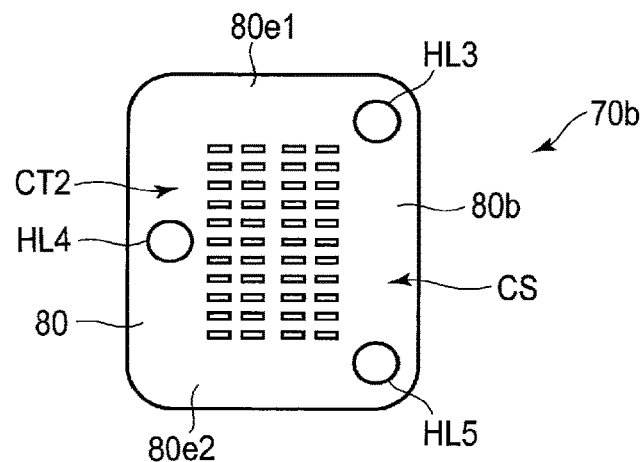
FIG. 8B is a plan view illustrating an example of the shape of the second connector.
Figure 8C:
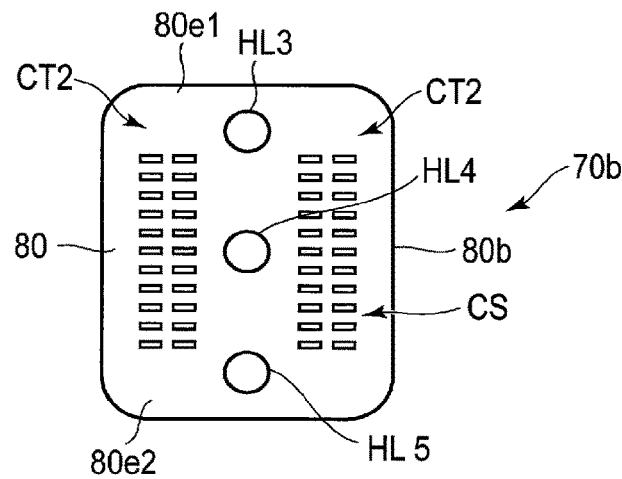
FIG. 8C is a plan view illustrating an example of the shape of the second connector.
Figure 8A:
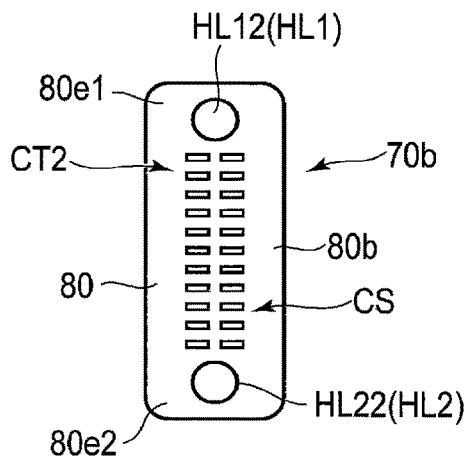
FIG. 8A is a plan view illustrating an example of the shape of the second connector.

In the example illustrated in FIG. 8A, the second connector 70b is formed in a rectangular shape extending in the longitudinal direction. As described above, the through hole HL12 is formed in the extension portion 80e1 of the base 80, and the through hole HL22 is formed in the extension portion 80e2 of the base 80. In the main body portion 80b of the base 80, the connection terminals CT2 are arranged in two columns along the longitudinal direction of the base 80. In each of the columns, the connection terminals CT2 are spaced apart from each other.

In the example illustrated in FIG. 8B, the second connector 70b extends in the longitudinal direction and is formed in a rectangular shape that is wider than the second connector 70b illustrated in FIG. 8A. A through hole HL3 is formed in the extension portion 80e1 of the base 80, a through hole HL4 is formed in the main body portion 80b of the base 80, and a through hole HL5 is formed in the extension portion 80e2 of the base 80. The through hole HL3 is positioned at the end portion of the transverse direction, the through hole HL4 is positioned at an end portion of a side opposite to the through hole HL3 in the transverse direction, and the through hole HL4 is positioned at an end portion on the same side as the through hole HL3 in the transverse direction. In other words, the through holes HL3, HL4, and HL5 are arranged in a zigzag shape. In the main body portion 80b of the base 80, the connection terminals CT2 are arranged in four columns along the longitudinal direction of the base 80. In each of the columns, the connection terminals CT2 are spaced apart from each other.

In the example illustrated in FIG. 8C, the second connector 70b extends in the longitudinal direction and is formed in a rectangular shape that is wider than the second connector 70b illustrated in FIG. 8A. A through hole HL3 is formed in the extension portion 80e1 of the base 80, a through hole HL4 is formed in the main body portion 80b of the base 80, and a through hole HL5 is formed in the extension portion 80e2 of the base 80. The through hole HL3 is positioned at the central portion of the transverse direction, the through hole HL4 is positioned at the central portion of the transverse direction, and the through hole HL5 is positioned at the central portion of the transverse direction. In other words, the through holes HL3, HL4, and HL5 are arranged linearly in the longitudinal direction at the central portion of the transverse direction. In the main body portion 80b of the base 80, the connection terminals CT2 are arranged in two columns aligned along the longitudinal direction and two columns aligned along the longitudinal direction with the through hole HL4 interposed therebetween. In each of the columns, the connection terminals CT2 are spaced apart from each other.

Figure 8D:
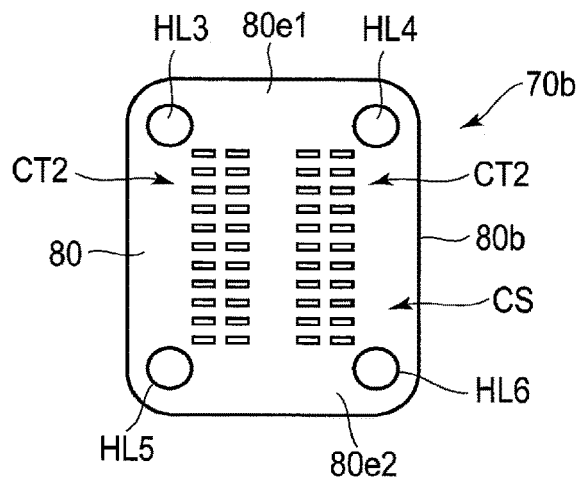
FIG. 8D is a plan view illustrating an example of the shape of the second connector.

In the example illustrated in FIG. 8D, the second connector 70b extends in the longitudinal direction and is formed in a rectangular shape that is wider than the second connector 70b illustrated in FIG. 8A. The through hole HL3 and HL4 are formed in the extension portion 80e1 of the base 80, and the through holes HL5 and HL6 are formed in the extension portion 80e2 of the base 80. The through hole HL3 is positioned at an end portion of the transverse direction, and the through hole HL4 is positioned at an end portion of a side opposite to the through hole HL3 in the transverse direction. The through hole HL5 is positioned at an end portion of the same side as the through hole HL3 in the transverse direction, and the through hole HL6 is positioned at an end of a side opposite to the through hole HL5 in the transverse direction. In the main body portion 80b of the base 80, the connection terminals CT2 are arranged in four columns along the longitudinal direction of the base 80. In each of the columns, the connection terminals CT2 are spaced apart from each other.

According to the present embodiment, the magnetic disk device 1 can electrically connect the electric component provided inside the housing 10 and the electric component provided outside the housing 10 in a state in which the housing 10 is kept airtight by the connection mechanism 60 including the FPC 62, the first connector 70a, and the second connector 70b. The FPC 62 includes the first connection portion 64a positioned inside the bottom wall 12a, the second connection portion 64b positioned on the outer surface of the bottom wall 12a, and the relay portion 64c which connects the first connection portion 64a and the second connection portion 64b. The first connection portion 64a includes the first connection pads CP1. The second connection portion 64b includes the second connection pads CP2. The second connector 70b is fixed to and electrically connected to the control circuit board 54 in such a manner that one end portion of each of the connection terminals CT2 is soldered on the inner surface of the control circuit board 54 at the soldering portion SO1. The second connector 70b includes, for example, the main body portion 80b having a counter surface CS, the extension portion 80e1 extending in the longitudinal direction from the main body portion 80b and having the through hole HL12 formed therein, the extension portion 80e2 extending from the main body portion 80b in a direction opposite to the extension portion 80e1 in the longitudinal direction and having the through hole HL22 formed therein, and the connection terminals CT2 fixed to the counter surface CS of the main body portion 80b. In the control circuit board 54, the through hole HL11 facing the through hole HL12 and the through hole HL21 facing the through hole HL22 are formed. On the outer surface of the bottom wall 12a, the HL13 facing the through holes HL11 and HL12 is formed and the hole portion HL23 facing the through holes HL21 and HL22 is formed. The control circuit board 54 and the second connector 70b are fixed to the outer surface of bottom wall 12a by the screw portion SW1 inserted into the hole portion HL1 including the through holes HL11 and HL12 and the hole portion HL13 and the screw portion SW2 inserted into the hole portion HL2 including the through holes HL21 and HL22 and the hole portion HL23. When the control circuit board 54 and the second connector 70b are fixed to the outer surface of the bottom wall 12a by the screw portions SW1 and SW2, the extension portions 80e1 and 80e2 contact the bottom wall 12a. When the control circuit board 54 and the second connector 70b are fixed to the outer surface of the bottom wall 12a by the screw portions SW1 and SW2, each of the connection terminals CT2 fixed to the counter surface CS of the main body portion 80b elastically abuts on and electrically connects to the second connection pads CP2, respectively. In the magnetic disk device 1, since the base 80 of the second connector 70b is positioned between the bottom wall 12a and the control circuit board 54, it is possible to prevent the control circuit board 54 from being deformed by the repulsive force generated when the connection terminals CT2 abut on the second connection pads CP2, respectively. Therefore, contact failure between the connection terminals CT2 and the second connection pads CP2, bending of the control circuit board 54, breakage of the control circuit board 54, or the like can be prevented. Therefore, the magnetic disk device 1 can improve the reliability.

Next, magnetic disk devices according to other embodiments and modifications will be described. In other embodiments and modifications, the same reference numerals are assigned to the same parts as those of the above-described embodiment, and the detailed description thereof will be omitted.

Modification 1

The magnetic disk device 1 of modification 1 differs from the magnetic disk device 1 of the first embodiment in terms of the configuration of a part of the control circuit board 54.

FIG. 9 is a cross-sectional view of a part of a bottom wall 12a of a magnetic disk device 1 according to modification 1.

In the example illustrated in FIG. 9, a hole portion HL1 includes a through hole HL12 and a hole portion HL13. In other words, the hole portion HL1 is formed by the through hole HL12 and the hole portion HL13. The hole portion HL2 includes the through hole HL22 and the hole portion HL23. In other words, the hole portion HL2 is formed by the through hole HL22 and the hole portion HL23. The second connector 70b is fixed to the outer surface of the bottom wall 12a in such a manner that screw portions SW1 and SW2 are screwed to the hole portions HL1 and HL2, respectively. In the example illustrated in FIG. 9, a head portion of the screw portion SW1 is positioned in the through hole HL11 of the control circuit board 54. A head portion of the screw portion SW2 is positioned in the through hole HL21 of the control circuit board 54.

According to modification 1, the magnetic disk device 1 includes a second connector 70b fixed to the outer surface of bottom wall 12a by the screw portion SW1 inserted into the hole portion HL1 including the through hole HL12 and the hole portion HL13 and the screw portion SW2 inserted into the hole portion HL2 including the through hole HL22 and the hole portion HL23. In the magnetic disk device 1, since the base 80 of the second connector 70b is positioned between the bottom wall 12a and the control circuit board 54, it is possible to prevent the control circuit board 54 from being deformed by the repulsive force generated when the connection terminals CT2 abut on the second connection pads CP2, respectively. Therefore, contact failure between the connection terminals CT2 and the second connection pads CP2, bending of the control circuit board 54, breakage of the control circuit board 54, or the like can be prevented. Therefore, the magnetic disk device 1 can improve the reliability.

Second Embodiment

A magnetic disk device 1 of a second embodiment differs from the magnetic disk devices 1 of the first embodiment and modification 1 in terms of the configuration of the connection mechanism 60.

FIG. 10 is a perspective view illustrating a base of a housing, from which most of components are removed, and FIG. 11 is a perspective view illustrating the rear side of the housing and a control circuit board.

As illustrated in FIGS. 10 and 11, in the bottom wall 12a of the base 12, for example, a rectangular through hole (through hole) 58 is formed at an end portion on one short side. The through hole 58 is opened in the inner surface and the outer surface (rear surface) of the bottom wall 12a. A first connection portion 641a of the connection mechanism 60 is attached to or inserted into the through hole 58.

As illustrated in FIGS. 10 and 11, a substantially rectangular mounting recess 71 is formed on the rear surface (outer surface) of the bottom wall 12a in a region opposed to the through hole 58 illustrated in FIG. 10. The bottom surface of the recess 71 constitutes an installation surface 72 (described later) which is positioned around the through hole 58.

The connection mechanism 60 includes a sealing substrate (relay member) 640, and a first connection portion 641a and a second connection portion 641b mounted on the sealing substrate 640. The sealing substrate 640 is formed in a substantially rectangular shape corresponding to the mounting recess 71 of the base 12 and is formed in a planar dimension slightly smaller than that of the mounting recess 71. The sealing substrate 640 is configured by, for example, a multilayer circuit board in which a plurality of printed circuit boards are stacked. The sealing substrate 640 has a flat first main surface 640a and a flat second main surface 640b on the side opposite to the first main surface 640a.

Positioning holes are respectively formed at two corner portions of the sealing substrate 640 facing the diagonal direction. The positioning holes are provided at positions corresponding to positioning pins of the base 12 and are formed so as to allow insertion of the positioning pins.

The first connection portion 641a is mounted at a substantially central portion of the first main surface 640a. The first connection portion 641a is formed in a rectangular shape. A plurality of first connection pads CP1 are provided on the surface (inner surface) facing a substrate unit 21 of the first connection portion 641a. The first connection pads CP1 are arranged in, for example, two columns. Each of the first connection pads CP1 is formed in, for example, a rectangular shape. Each of the columns extends in a direction orthogonal to a longitudinal direction of the FPC 62, for example, in a width direction. In each of the columns, the plurality of first connection pads, for example, six first connection pads are spaced apart from each other. In addition, the two columns are spaced apart from each other and extend parallel to each other.

The second connection portion 641b is mounted at a substantially central portion of the second main surface 640b and faces the first connection portion 641a via the sealing substrate 640. The second connection portion 641b is formed in a rectangular shape. A plurality of second connection pads CP2 are provided on the surface (outer surface) facing a second connector 70b of the second connection portion 641b. Each of the second connection pads CP2 is formed in, for example, a rectangular shape. The second connection pads CP2 are arranged in, for example, two columns. Each of the columns extends in the width direction of the FPC 62. In each of the columns, the plurality of second connection pads, for example, six second connection pads are spaced apart from each other. In addition, the two columns are spaced apart from each other and extend parallel to each other.

The first connection portion 641a (first connection pad CP1) and the second connection portion 641b (second connection pad CP2) are electrically connected to each other via a conductive layer formed in the sealing substrate 640 and a conductive path formed by a through hole or the like.

As illustrated in FIG. 11, the connection mechanism 60 is mounted on a mounting recess 71 formed in the bottom wall 12a of the base 12. That is, the sealing substrate 640 is mounted on the mounting recess 71 in a state in which the first main surface 640a and the first connection portion 641a face the bottom wall 12a side. The first connection portion 641a is inserted into the through hole 58 of the bottom wall 12a. The first connection portion 641a is exposed to the inside of the base 12 via the through hole 58 and is accessible from the inside of the base 12.

The first connection portion 641a of the connection mechanism 60 is inserted into the through hole 58 and is exposed to the inside of the base 12 via the through hole 58, that is, the other connector is provided to be able to connect to the first connection portion 641a from the inside of the base 12. The first connector 70a of the substrate unit 21 provided in the base 12 is connected to the first connection portion 641a of the connection mechanism 60.

The second connection portion 641b of the connection mechanism 60 is exposed to the outer surface (rear surface) side of the base 12. The second connector 70b is connected to the second connection portion 641b of the connection mechanism 60. As described above, in a state in which the airtightness in the housing 10 is maintained by the connection mechanism 60, the magnetic head 32 and the voice coil of the VCM 24 provided in the base 12 are electrically connected to the control circuit board 54 provided outside the base 12 via the relay FPC, the substrate unit 21, the first connector 70a, the first connection portion 641a, the second connection portion 641b, and the second connector 70b.

Figure 12:
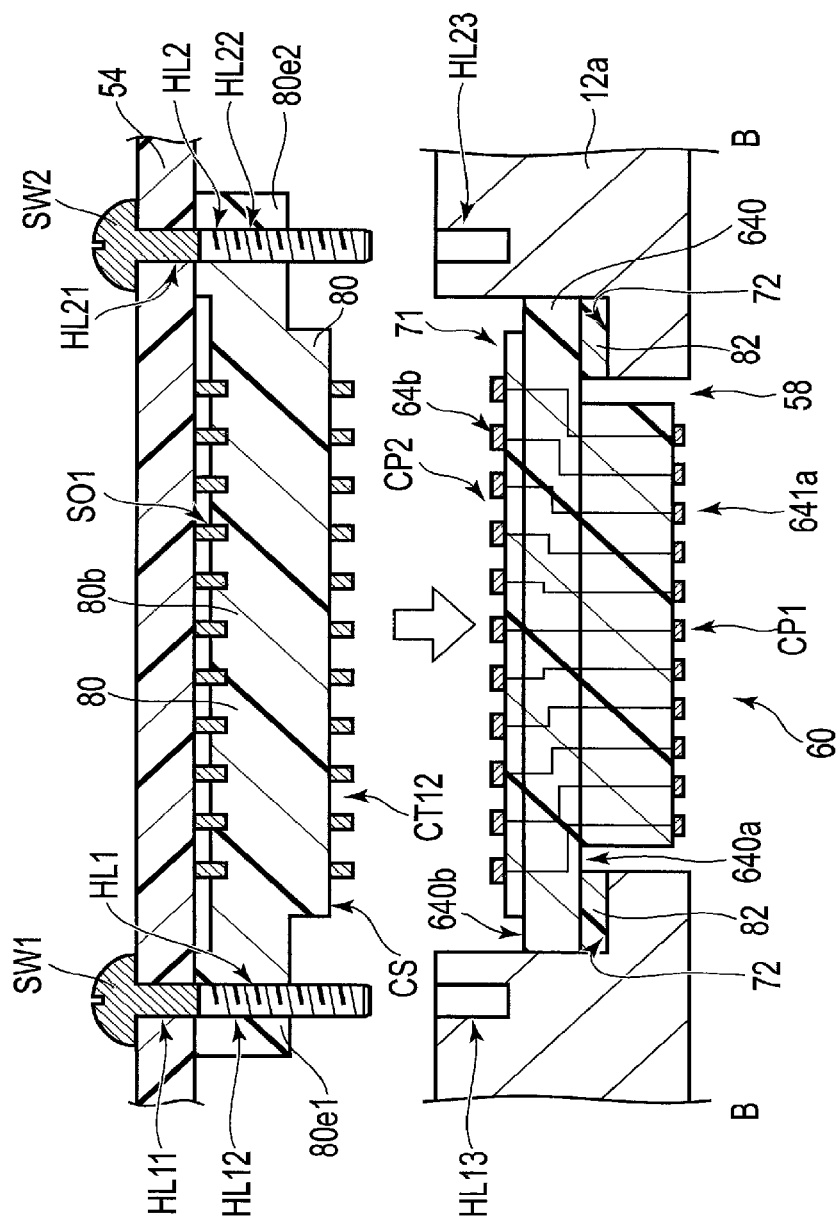
FIG. 12 is an exploded cross-sectional view of a part of a bottom wall of the magnetic disk device, taken along line B-B illustrated in FIG. 11.
Figure 13:
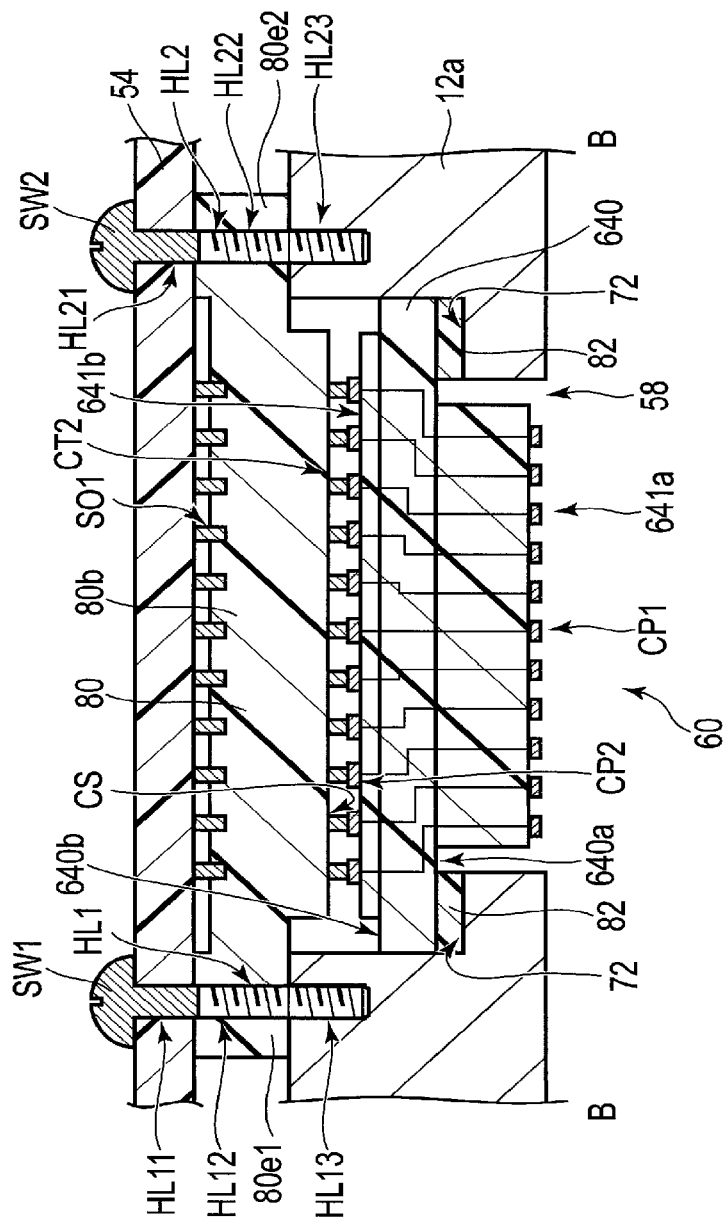
FIG. 13 is a cross-sectional view of the bottom wall of the magnetic disk device, taken along line B-B illustrated in FIG. 11.

FIG. 12 is an exploded cross-sectional view of a part of the bottom wall 12a of the magnetic disk device 1, taken along line B-B illustrated in FIG. 11, and FIG. 13 is a cross-sectional view of a part of the bottom wall 12a of the magnetic disk device 1, taken along line B-B illustrated in FIG. 11.

As illustrated in FIGS. 12 and 13, a sealing material is provided between the installation surface 72 of the mounting recess 71 and the first main surface 640a of the sealing substrate 640. The sealing substrate 640 is fixed to the installation surface 72 by the sealing material 82. In the present embodiment, for example, solder is used as the sealing material 82.

The sealing substrate 640 is fixed to the installation surface 72 of the base 12 by the sealing material 82 and covers the through hole 58 of the base 12. At the same time, a space between the first main surface 640a of the sealing substrate 640 and the installation surface 72 is airtightly sealed by the sealing material 82. Therefore, the connection mechanism 60 airtightly seals the through hole 58 on the rear side of the base 12.

In the example illustrated in FIG. 13, when the control circuit board 54 and the second connector 70b are fixed to the outer surface of the bottom wall 12a by the screw portions SW1 and SW2, the connection terminals CT2 fixed to the counter surface CS of the main body portion 80b elastically abut on and electrically connect to the second connection pads CP2 provided on the second connection portion 641b, respectively.

According to the second embodiment, the magnetic disk device 1 includes the control circuit board 54 and the second connector 70b fixed to the outside of the bottom wall 12a by the screw portions SW1 and SW2. In the magnetic disk device 1, since the base 80 of the second connector 70b is positioned between the bottom wall 12a and the control circuit board 54, it is possible to prevent the control circuit board 54 from being deformed by the repulsive force generated when the connection terminals CT2 abut on the second connection pads CP2, respectively. Therefore, contact failure between the connection terminals CT2 and the second connection pads CP2, bending of the control circuit board 54, breakage of the control circuit board 54, or the like can be prevented. Therefore, the magnetic disk device 1 can improve the reliability.

Third Embodiment

A magnetic disk device 1 of a third embodiment differs from the second embodiment in terms of the configuration of the control circuit board 54 and the second connector 70b.

Figure 14:
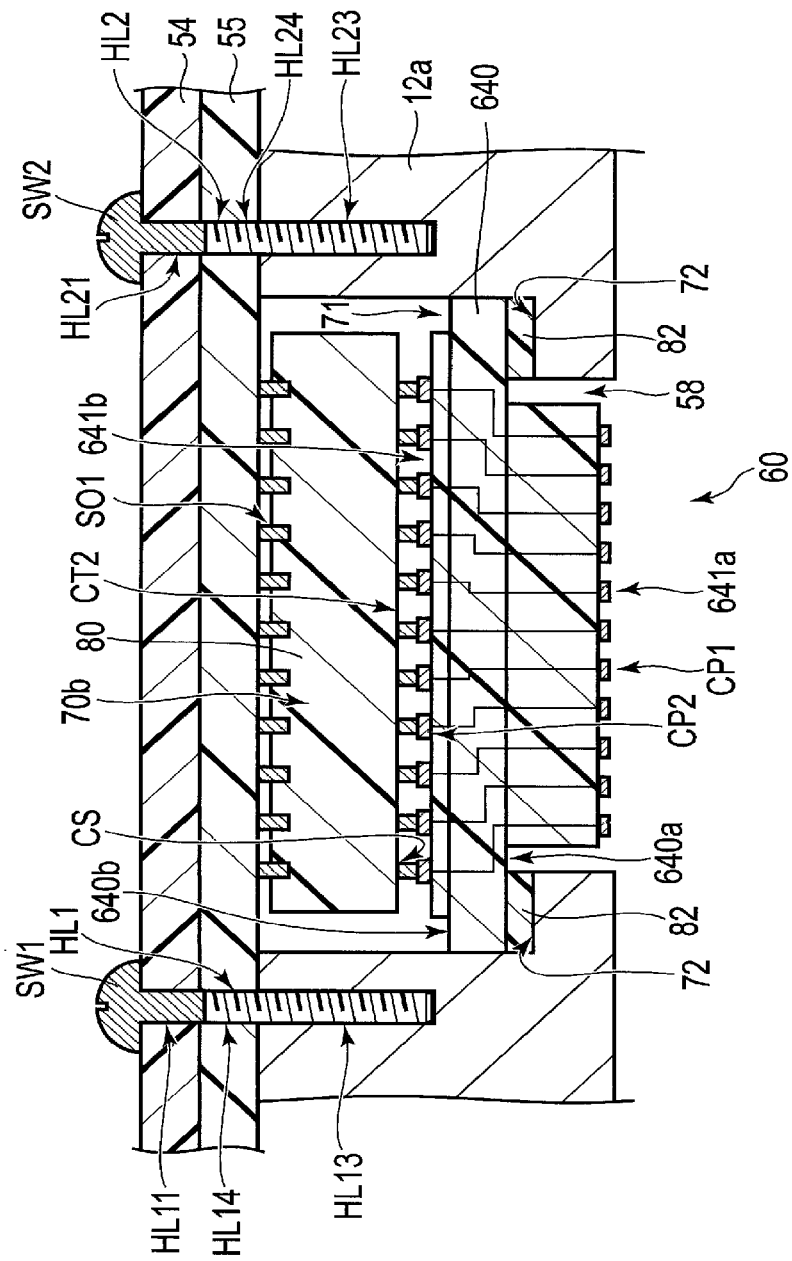
FIG. 14 is a cross-sectional view of a part of a bottom wall of a magnetic disk device according to a third embodiment.

FIG. 14 is a cross-sectional view of a part of a bottom wall 12a of a magnetic disk device 1 according to a third embodiment.

In the example illustrated in FIG. 14, a reinforcement member 55 is provided between the inner surface of the control circuit board 54 and the outer surface of the bottom wall 12a. The reinforcement member 55 is formed of, for example, a metal member or a resin member. The reinforcement member 55 contacts the inner surface of the control circuit board 54 and the outer surface of the bottom wall 12a. For example, the reinforcement member 55 is bonded to the inner surface of the control circuit board 54. The reinforcement member 55 may not contact at least one of the inner surface of the control circuit board 54 and the outer surface of the bottom wall 12a. In the reinforcement member 55, a through hole HL14 facing a through hole HL11 of the control circuit board 54 and a hole portion HL13 of the bottom wall 12a and a through hole HL24 facing a through hole HL21 of the control circuit board 54 and a hole portion HL23 of the bottom wall 12a are formed. The through holes HL14 and HL24 are, for example, screw holes in which a screw groove is formed on the inner surface. The through holes HL14 and HL24 may not be screw holes. The reinforcement member 55 may be bonded to the inner surface of the control circuit board 54 by an adhesive or the like. In addition, the peripheries of the through hole HL14 and the through hole HL24 of the reinforcement member 55 may respectively protrude toward the bottom wall 12a.

The base 80 of the second connector 70b is fixed to the reinforcement member 55 in such a manner that one end portion of each of the connection terminals CT2 is soldered to the inner surface of the reinforcement member 55 facing the second connection portion 64b at a soldering portion SO1. One end portion of the connection terminal CT2 is soldered to the reinforcement member 55 at the soldering portion SO1 and is electrically connected to the control circuit board 54 via the reinforcement member 55.

In the example illustrated in FIG. 14, the hole portion HL13 of the bottom wall 12a faces the through hole HL11 and the through hole HL14, and the hole portion HL23 of the bottom wall 12a faces the through holes HL21 and HL24. In the bottom wall 12a, the hole portions HL13 and HL23 are formed around the connection mechanism 60, for example, the second connection portion 641b. The periphery of the hole portion HL13 of the bottom wall 12a may protrude toward the reinforcement member 55, and the periphery of the hole portion HL23 of the bottom wall 12a may protrude toward the reinforcement member 55. In the example illustrated in FIG. 14, the hole portion HL1 includes the through holes HL11 and HL14 and the hole portion HL13. In other words, the hole portion HL1 is formed by the through holes HL11 and HL14 and the hole portion HL13. The hole portion HL2 includes the through holes HL21 and HL24 and the hole portion HL23. In other words, the hole portion HL2 is formed by the through holes HL21 and HL24 and the hole portion HL23.

In the example illustrated in FIG. 14, the control circuit board 54 and the reinforcement member 55 are fixed to the outer surface of the bottom wall 12a by the screw portions SW1 and SW2. The reinforcement member 55 may be bonded to the outer surface of the bottom wall 12a by an adhesive, or may be fixed to the outer surface of the bottom wall 12a by a connector. The screw portion SW1 is screwed into the hole portion HL1. The screw portion SW2 is screwed into the hole portion HL2. The control circuit board 54 and the reinforcement member 55 are fixed to the outer surface of the bottom wall 12a in such a manner that the screw portions SW1 and SW2 are screwed to the hole portions HL1 and HL2, respectively. When the control circuit board 54 and the reinforcement member 55 are fixed to the outer surface of the bottom wall 12a by the screw portions SW1 and SW2, the reinforcement member 55 contacts the outer surface of the bottom wall 12a. When the control circuit board 54 and the reinforcement member 55 are fixed to the outer surface of the bottom wall 12a by the screw portions SW1 and SW2, the connection terminals CT2 fixed to the counter surface CS of the base 80 elastically abut on and electrically connect to the second connection pads CP2 provided on the second connection portion 641b, respectively.

According to the third embodiment, the magnetic disk device 1 includes the control circuit board 54 and the reinforcement member 55 fixed to the outer surface of bottom wall 12a by the screw portion SW1 inserted into the hole portion HL1 including the through holes HL11 and HL14 and the hole portion HL13 and the screw portion SW2 inserted into the hole portion HL2 including the through holes HL21 and HL24 and the hole portion HL23. In the magnetic disk device 1, since the reinforcement member 55 is positioned between the second connector 70b and the control circuit board 54, it is possible to prevent the control circuit board 54 from being deformed by the repulsive force generated when the connection terminals CT2 abut on the second connection pads CP2, respectively. Therefore, contact failure between the connection terminals CT2 and the second connection pads CP2, bending of the control circuit board 54, breakage of the control circuit board 54, or the like can be prevented. Therefore, the magnetic disk device 1 can improve the reliability.

Modification 2

The magnetic disk device 1 of modification 2 differs from the magnetic disk device 1 of the third embodiment in terms of the configuration that fixes the second connector 70b to the reinforcement member 55.

Figure 15:
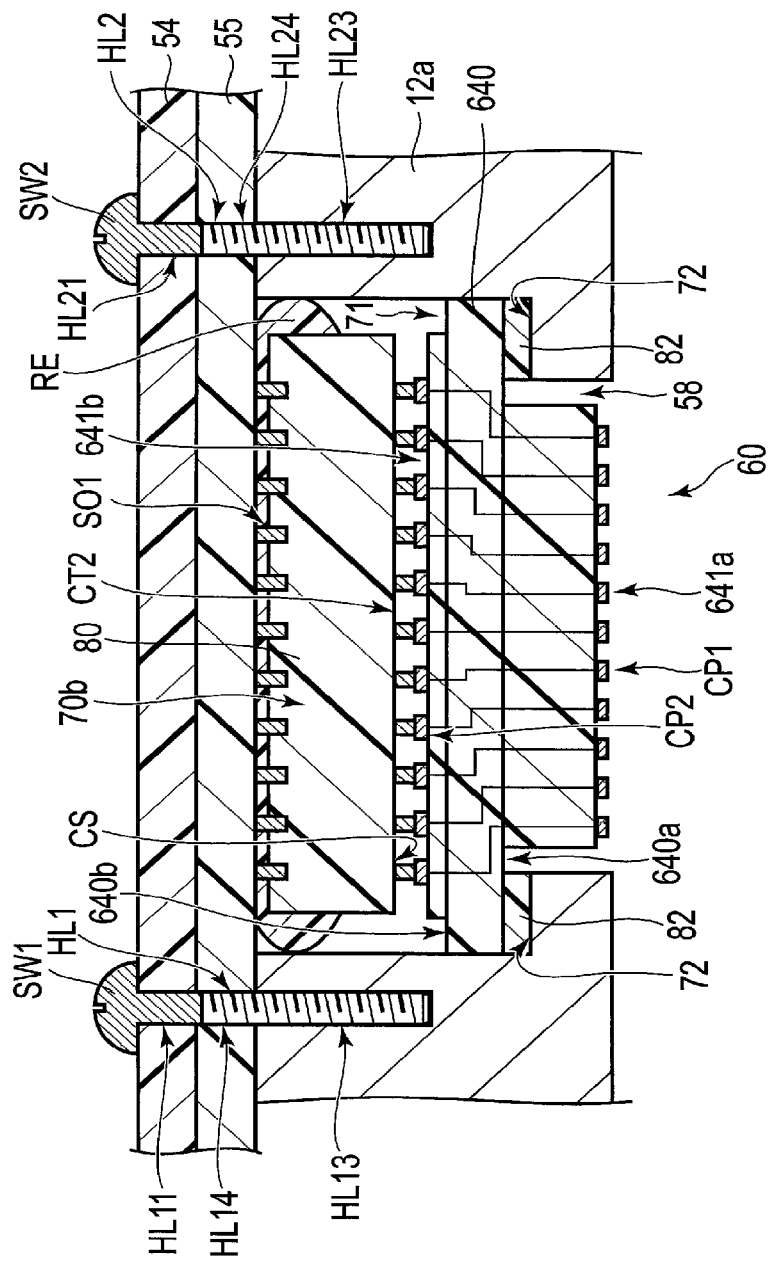
FIG. 15 is a cross-sectional view of a part of a bottom wall of a magnetic disk device according to modification 2.

FIG. 15 is a cross-sectional view of a part of a bottom wall 12a of a magnetic disk device 1 according to modification 2.

In the example illustrated in FIG. 15, a resin member RE is positioned between a second connector 70b (base 80) and a reinforcement member 55. The resin member RE is provided so as to cover the outside of the second connector 70b.

According to modification 2, in the magnetic disk device 1, the resin member RE is provided between the second connector 70b and the reinforcement member 55. In the magnetic disk device 1, since the reinforcement member 55 and the resin member RE are positioned between the second connector 70b and the control circuit board 54, it is possible to prevent the control circuit board 54 from being deformed by the repulsive force generated when the connection terminals CT2 abut on the second connection pads CP2, respectively. Therefore, contact failure between the connection terminals CT2 and the second connection pads CP2, bending of the control circuit board 54, breakage of the control circuit board 54, or the like can be prevented. Therefore, the magnetic disk device 1 can improve the reliability.

Fourth Embodiment

A magnetic disk device 1 of a fourth embodiment differs from the third embodiment and modification 2 in terms of the configuration of the reinforcement member 55.

Figure 16:
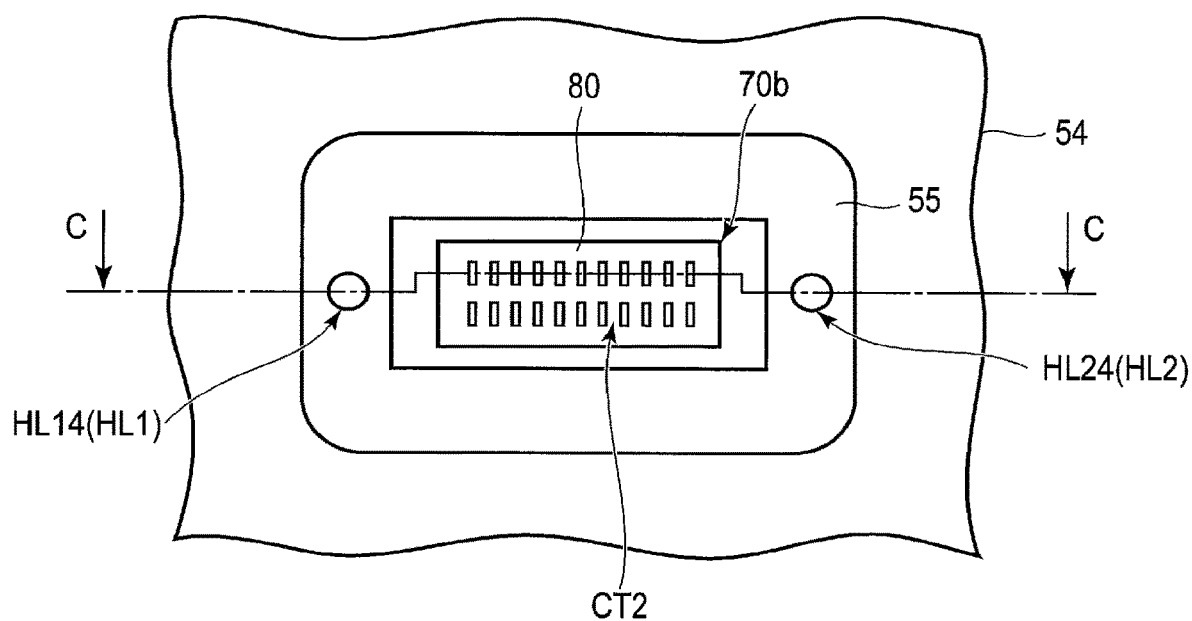
FIG. 16 is a plan view of a second connector, a control circuit board, and a reinforcement member according to a fourth embodiment, when viewed from the inner surface side of the control circuit board.

FIG. 16 is a plan view of a second connector 70b, a control circuit board 54, and a reinforcement member 55 according to a fourth embodiment, when viewed from the inner surface side of the control circuit board 54.

In the example illustrated in FIG. 16, the reinforcement member 55 is disposed so as to surround the periphery of the second connector 70b. The reinforcement member 55 is formed in a hollow oval shape. The second connector 70b is disposed in the hollow portion of the reinforcement member 55.

Figure 17:
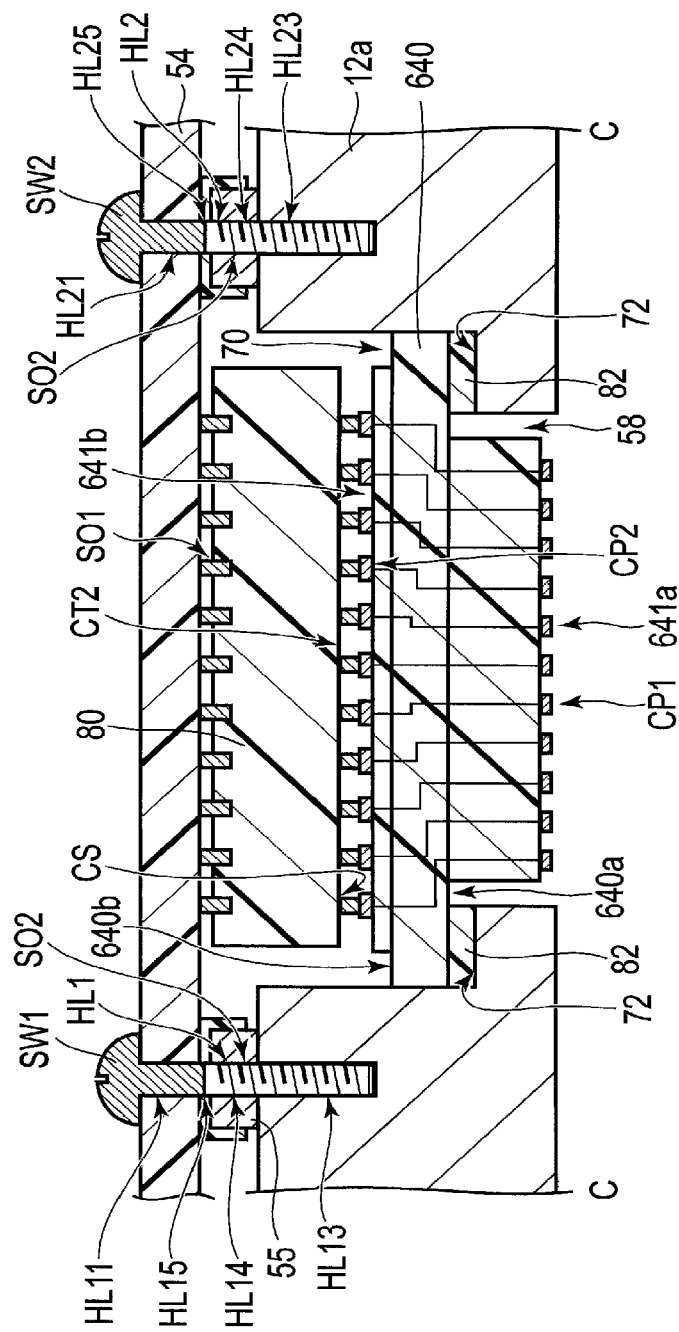
FIG. 17 is a cross-sectional view of a part of a bottom wall of a magnetic disk device according to a fourth embodiment.

FIG. 17 is a cross-sectional view of a part of a bottom wall 12a of the magnetic disk device 1 according to the fourth embodiment.

In the example illustrated in FIG. 17, the reinforcement member 55 is provided between the inner surface of the control circuit board 54 and the outer surface of the bottom wall 12a. The reinforcement member 55 contacts the inner surface of the control circuit board 54 and the outer surface of the bottom wall 12a. For example, the reinforcement member 55 is bonded to the inner surface of the control circuit board 54 by soldering at a soldering portion SO2. In the soldering portion SO2, a through hole HL15 facing through holes HL11 and HL14 and a through hole HL25 facing through holes HL21 and HL24 are formed. The peripheries of the through hole HL14 and the through hole HL24 of the reinforcement member 55 may respectively protrude toward the bottom wall 12a.

The base 80 of the second connector 70b is fixed by the control circuit board 54 in such a manner that one end portion of each of the connection terminals CT2 is soldered to the inner surface of the control circuit board 54 facing the second connection portion 641b at the soldering portion SO1. One end portion of the connection terminal CT2 is soldered to the control circuit board 54 at the soldering portion SO1 and is electrically connected to the control circuit board 54.

In the example illustrated in FIG. 17, the hole portion HL13 of the bottom wall 12a faces the through holes HL11 and HL14 and the through hole HL15, and the hole portion HL23 of the bottom wall 12a faces the through holes HL21, HL24, and HL25. In the example illustrated in FIG. 17, the hole portion HL1 includes the through holes HL11, HL14, and HL15 and the hole portion HL13. In other words, the hole portion HL1 is formed by the through holes HL11, HL14, and HL15 and the hole portion HL13. The hole portion HL2 includes the through holes HL21, HL24, and HL25 and the hole portion HL23. In other words, the hole portion HL2 is formed by the through holes HL21, HL24, and HL25 and the hole portion HL23.

According to the fourth embodiment, the magnetic disk device 1 includes the control circuit board 54 and the reinforcement member 55 fixed to the outer surface of bottom wall 12a by the screw portion SW1 inserted into the hole portion HL1 including the through holes HL11, HL14, and HL15 and the hole portion HL13 and the screw portion SW2 inserted into the hole portion HL2 including the through holes HL21, HL24, and HL25 and the hole portion HL23. In the magnetic disk device 1, since the reinforcement member 55 is positioned between the bottom wall 12a and the control circuit board 54, it is possible to prevent the control circuit board 54 from being deformed by the repulsive force generated when the connection terminals CT2 abut on the second connection pads CP2, respectively. Therefore, contact failure between the connection terminals CT2 and the second connection pads CP2, bending of the control circuit board 54, breakage of the control circuit board 54, or the like can be prevented. Therefore, the magnetic disk device 1 can improve the reliability.

Fifth Embodiment

A magnetic disk device 1 of a fifth embodiment differs from the embodiment and modification in terms of the configuration of the connection mechanism 60.

FIG. 18 is a perspective view illustrating a base of a housing, from which most of components are removed, and FIG. 19 is a perspective view illustrating the rear side of the housing and a control circuit board.

The first connector 70a is configured as a hermetic connector.

A first connection portion 641a is mounted at a substantially central portion of the first main surface 640a. The first connection portion 641a is formed in a rectangular shape. The first connection portion 641a is configured as a connector, for example, a hermetic connector. The first connection portion 641a is fitted to and electrically connected to the first connector 70a.

The second connector 70b is configured as a hermetic connector.

The second connection portion 641b is mounted at a substantially central portion of a second main surface 640b and faces the first connection portion 641a. The second connection portion 641b is formed in a rectangular shape. The second connection portion 641b is configured as a connector, for example, a hermetic connector. The second connection portion 641b is fitted to and electrically connected to the second connector 70b.

According to the fifth embodiment, in the magnetic disk device 1, since the base 80 of the second connector 70b is positioned between the bottom wall 12a and the control circuit board 54, it is possible to prevent the control circuit board 54 from being deformed by the repulsive force generated when the connection terminals CT2 abuts on the second connection pads CP2, respectively. Therefore, contact failure between the connection terminals CT2 and the second connection pads CP2, bending of the control circuit board 54, breakage of the control circuit board 54, or the like can be prevented. Therefore, the magnetic disk device 1 can improve the reliability.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic disk device, comprising:
a housing having a box-shaped base with a bottom wall;
a first connection portion provided inside the bottom wall;
a second connection portion provided outside the bottom and electrically connected to the first connection portion;
a control circuit board provided outside the housing;
a third connection portion fixed to an inner surface of the control circuit board facing the bottom wall, and abutting on the second connection portion; and
a reinforcement member positioned between the control circuit board and the third connection portion, and the bottom wall,
wherein the control circuit board and the reinforcement member are fixed to the bottom wall by a screw inserted into a first through hole formed in the control circuit board, a second through hole formed in the reinforcement member and facing the first through hole, and a bottomed first hole portion formed on the bottom wall and facing the second through hole.

2. The magnetic disk device according to claim 1,
wherein the second connection portion comprises a plurality of pads, and
the third connection portion comprises a plurality of connection terminals which elastically abut on the pads, respectively.

3. The magnetic disk device according to claim 1, wherein a resin member is provided between the reinforcement member and the third connection portion.

4. A magnetic disk device, comprising:
a housing having a box-shaped base with a bottom wall;
a first connection portion provided inside the bottom wall;
a second connection portion provided outside the bottom wall and electrically connected to the first connection portion;
a control circuit board provided outside the housing;
a third connection portion fixed to an inner surface of the control circuit board facing the bottom wall, and abutting on the second connection portion; and
a reinforcement member positioned between the control circuit board and the third connection portion, and the bottom wall;
wherein the third connection portion is fixed to the reinforcement member, and the control circuit board and the reinforcement member are fixed to the bottom wall by a screw inserted into a first through hole formed in the control circuit board, a second through hole formed in the reinforcement member and facing the first through hole, and a bottomed first hole portion formed on the bottom wall and facing the second through hole.

5. The magnetic disk device according to claim 4,
wherein the second connection portion comprises a plurality of pads, and
the third connection portion comprises a plurality of connection terminals which elastically abut on the pads, respectively.

6. A magnetic disk device comprising:
a housing having a box-shaped base with a bottom wall;
a first connection portion provided inside the bottom wall;
a second connection portion provided outside the bottom wall and electrically connected to the first connection portion;
a control circuit board provided outside the housing; and
a third connection portion comprising a first portion fixed to an inner surface of the control circuit board facing the bottom wall, abutting on the second connection portion, and electrically connected to the second connection portion, and a second portion contacting the control circuit board and extending from the first portion,
wherein the control circuit board and the reinforcement member are fixed to the bottom wall by a screw inserted into a first through hole formed in the control circuit board, a second through hole formed in the second portion and facing the first through hole, and a bottomed first hole portion formed on the bottom wall and facing the second through hole.

7. The magnetic disk device according to claim 6,
Wherein the second connection portion comprises a plurality of pads, and
the third connection portion comprises a plurality of connection terminals which elastically abut on the pads, respectively.

* * * * *